US012308615B2

(12) United States Patent
Feezell et al.

(10) Patent No.: US 12,308,615 B2
(45) Date of Patent: May 20, 2025

(54) NON-C-PLANE GROUP III-NITRIDE-BASED VCSELs WITH NANOPOROUS DISTRIBUTED BRAGG REFLECTOR MIRRORS

(71) Applicant: UNM RAINFOREST INNOVATIONS, Albuquerque, NM (US)

(72) Inventors: Daniel F. Feezell, Albuquerque, NM (US); Morteza Monavarian, Albuquerque, NM (US); Saadat M. Mishkat-Ul-Masabih, Albuquerque, NM (US)

(*) Notice: Subject to any disclaimer, the term of this patent is extended or adjusted under 35 U.S.C. 154(b) by 822 days.

(21) Appl. No.: 17/185,868

(22) Filed: Feb. 25, 2021

(65) Prior Publication Data

US 2021/0273412 A1 Sep. 2, 2021

Related U.S. Application Data

(60) Provisional application No. 62/981,300, filed on Feb. 25, 2020.

(51) Int. Cl.
*H01S 5/183* (2006.01)
*H01S 5/02* (2006.01)
(Continued)

(52) U.S. Cl.
CPC ........ *H01S 5/18363* (2013.01); *H01S 5/0206* (2013.01); *H01S 5/02469* (2013.01); *H01S 5/042* (2013.01); *H01S 5/18308* (2013.01); *H01S 5/18347* (2013.01); *H01S 5/18355* (2013.01); *H01S 5/18361* (2013.01); *H01S 5/18369* (2013.01); *H01S 5/2275* (2013.01); *H01S 5/32025* (2019.08); *H01S 5/34333* (2013.01)

(58) Field of Classification Search
CPC ............... H01S 5/18363; H01S 5/0206; H01S 5/02469; H01S 5/042; H01S 5/18308; H01S 5/18355; H01S 5/18361; H01S 5/18369; H01S 5/2275; H01S 5/32025; H01S 5/34333
See application file for complete search history.

(56) References Cited

U.S. PATENT DOCUMENTS 4,877,641 A 10/1989 Dory
6,185,241 B1 * 2/2001 Sun ..................... H01S 5/04253
372/96

(Continued)

OTHER PUBLICATIONS

Leonard, J. T. et al. "Nonpolar III-nitride vertical-cavity surface-emitting laser with a photoelectrochemically etched air-gap aperture." Applied Physics Letters 108.3 (2016).
(Continued)

*Primary Examiner* — Yuanda Zhang
(74) *Attorney, Agent, or Firm* — MH2 Technology Law Group LLP

(57) ABSTRACT

An electrically injected vertical-cavity surface emitting laser (VCSEL) and a method of manufacturing the same is disclosed. The electrically injected VCSEL includes a non-c-plane substrate and a nanoporous bottom distributed Bragg reflector (DBR) comprising a plurality of alternating highly doped III-nitride layers and unintentionally doped III-nitride layers formed above the substrate.

20 Claims, 14 Drawing Sheets

(51) Int. Cl.
H01S 5/024 (2006.01)
H01S 5/042 (2006.01)
H01S 5/227 (2006.01)
H01S 5/32 (2006.01)
H01S 5/343 (2006.01)

(56) References Cited

U.S. PATENT DOCUMENTS

| | | | | |
|---|---|---|---|---|
| 6,628,685 | B1* | 9/2003 | Shieh | B82Y 20/00 |
| | | | | 372/45.01 |
| 9,206,524 | B2 | 12/2015 | Zhang et al. | |
| 9,583,353 | B2 | 2/2017 | Han | |
| 10,458,038 | B2 | 10/2019 | Zhang et al. | |
| 2014/0023102 | A1* | 1/2014 | Holder | H01S 5/0654 |
| | | | | 372/44.01 |
| 2015/0303655 | A1 | 10/2015 | Han et al. | |
| 2017/0133826 | A1 | 5/2017 | Han | |
| 2017/0237234 | A1* | 8/2017 | Han | H01L 33/32 |
| | | | | 372/45.012 |
| 2020/0035843 | A1* | 1/2020 | Zhao | H01L 31/035236 |
| 2020/0185882 | A1* | 6/2020 | Zhao | H01S 5/18361 |
| 2022/0239068 | A1* | 7/2022 | Kearns | H01S 5/3095 |

OTHER PUBLICATIONS

Leonard, John T. III-Nitride Vertical-Cavity Surface-Emitting Lasers. University of California, Santa Barbara, 2016.
Leonard, J. T. et al. "Smooth e-beam-deposited tin-doped indium oxide for III-nitride vertical-cavity surface-emitting laser intracavity contacts." Journal of Applied Physics 118.14 (2015).
Liu, Wen-Jie et al. "Room temperature continuous wave lasing of electrically injected GaN-based vertical cavity surface emitting lasers." Applied Physics Letters 104.25 (2014).
Liu, Weili et al. "Thermoelectric effects in wurtzite GaN and AlxGa1-xN alloys." Journal of Applied Physics 97.12 (2005).
Lu, Tien-Chang et al. "CW lasing of current injection blue GaN-based vertical cavity surface emitting laser." Applied Physics Letters 92.14 (2008).
Lu, Tien-Chang et al. "Continuous wave operation of current injected GaN vertical cavity surface emitting lasers at room temperature." Applied Physics Letters 97.7 (2010).
Lu, Tien-Chang et al. "Development of GaN-based vertical-cavity surface-emitting lasers." IEEE Journal of selected topics in quantum electronics 15.3 (2009): 850-860.
Lutwak, R. et al. "The chip-scale atomic clock-prototype evaluation." Proceedings of the 39th annual precise time and time interval meeting. 2007.
Matioli, Elison et al. "Polarized light extraction in m-plane GaN light-emitting diodes by embedded photonic-crystals." Applied Physics Letters 98.25 (2011).
Matsubara, Kensuke et al. "Frequency measurement of the optical clock transition of 40Ca+ ions with an uncertainty of 10-14 level." Applied physics express 1.6 (2008): 067011.
McKendry, Jonathan JD et al. "High-speed visible light communications using individual pixels in a micro light-emitting diode array." IEEE Photonics Technology Letters 22.18 (2010): 1346-1348.
Mei, Yang et al. "Quantum dot vertical-cavity surface-emitting lasers covering the 'green gap'." Light: Science & Applications 6.1 (2017): e16199-e16199.
Melo, T. et al. "Gain comparison in polar and nonpolarsemipolar gallium-nitride-based laser diodes." Semiconductor Science and Technology 27.2 (2012): 024015.
Miah, Md Jarez et al. "Fabrication and characterization of low-threshold polarization-stable VCSELs for Cs-based miniaturized atomic clocks." IEEE Journal of Selected Topics in Quantum Electronics 19.4 (2013): 1701410-1701410.
Michalzik, Rainer. "VCSEL fundamentals." VCSELs: fundamentals, technology and applications of vertical-cavity surface-emitting lasers. Berlin, Heidelberg: Springer Berlin Heidelberg, 2012. 19-75.

Mishkat-Ul-Masabih, Saadat et al. "Nanoporous distributed Bragg reflectors on free-standing nonpolar m-plane GaN." Applied Physics Letters 112.4 (2018).
Mishkat-Ul-Masabih, Saadat et al. "Polarization-pinned emission of a continuous-wave optically pumped nonpolar GaN-based VCSEL using nanoporous distributed Bragg reflectors." Optics express 27.7 (2019): 9495-9501.
Mishkat-Ul-Masabih, Saadat et al. "Electrically injected nonpolar GaN-based VCSELs with lattice-matched nanoporous distributed Bragg reflector mirrors." Applied Physics Express 12.3 (2019): 036504.
Mowla, Alireza et al. "Concurrent reflectance confocal microscopy and laser Doppler flowmetry to improve skin cancer imaging: A Monte Carlo model and experimental validation." Sensors 16.9 (2016): 1411.
Muth, J. F. et al. "Absorption coefficient, energy gap, exciton binding energy, and recombination lifetime of GaN obtained from transmission measurements." Applied Physics Letters 71.18 (1997): 2572-2574.
Nakajima, Hiroshi et al. "Single transverse mode operation of GaN-based vertical-cavity surface-emitting laser with monolithically incorporated curved mirror." Applied Physics Express 12.8 (2019): 084003.
Nakamura, Shuji et al. "Candela-class high-brightness InGaN/AlGaN double-heterostructure blue-light-emitting diodes." Applied Physics Letters 64.13 (1994): 1687-1689.
Pantha, B. N. et al. "Thermoelectric properties of InxGa1-xN alloys." Applied Physics Letters 92.4 (2008).
Piprek, J. et al. "Minimum temperature sensitivity of 1.55 μm vertical-cavity lasers at-30 nm gain offset." Applied physics letters 72.15 (1998): 1814-1816.
Piprek, J. et al. "Simulation and analysis of 1.55 μm double-fused vertical-cavity lasers." Journal of Applied Physics 81.8 (1997): 3382-3390.
Poher, V. et al. "Micro-LED arrays: a tool for two-dimensional neuron stimulation." Journal of Physics D: Applied Physics 41.9 (2008): 094014.
Purcell, Edward M. et al. "Resonance absorption by nuclear magnetic moments in a solid." Physical review 69.1-2 (1946): 37.
Rampal, V. V. "Blue green lasers and their military potential." Defence Science Journal 33.2 (1983): 183-193.
Raoufi, Davood et al. "Surface characterization and microstructure of ITO thin films at different annealing temperatures." Applied Surface Science 253.23 (2007): 9085-9090.
Rashidi, Arman et al. "High-speed nonpolar InGaN/GaN LEDs for visible-light communication." IEEE Photonics Technology Letters 29.4 (2017): 381-384.
Romanov, A. E. et al. "Strain-induced polarization in wurtzite III-nitride semipolar layers." Journal of Applied Physics 100.2 (2006).
Ryu, Jae Hyoung et al. "High performance of InGaN light-emitting diodes by air-gap/GaN distributed Bragg reflectors." Optics Express 20.9 (2012): 9999-10003.
Schade, L. et al. "On the optical polarization properties of semipolar InGaN quantum wells." Applied Physics Letters 99.5 (2011).
Scheibenzuber, W. G. et al. "Calculation of optical eigenmodes and gain in semipolar and nonpolar InGaN/GaN laser diodes." Physical Review B—Condensed Matter and Materials Physics 80.11 (2009): 115320.
Schmidt, Aaron J. et al. "A frequency-domain thermoreflectance method for the characterization of thermal properties." Review of scientific instruments 80.9 (2009).
Serkland, Darwin K. et al. "VCSELs for atomic sensors." Vertical-Cavity Surface-Emitting Lasers XI. vol. 6484. SPIE, 2007.
Seurin, Jean-Francois. "Harnessing light for high-power applications." SPIE newsroom 10 (2009).
Sharma, R., et al. "Vertically oriented GaN-based air-gap distributed Bragg reflector structure fabricated using band-gap-selective photoelectrochemical etching." Applied Physics Letters 87.5 (2005).
Sharma, R., et al. "Gallium-nitride-based microcavity light-emitting diodes with air-gap distributed Bragg reflectors." Applied Physics Letters 91.21 (2007).

(56) References Cited

OTHER PUBLICATIONS

Shiu, Guo-Yi et al. "InGaN light-emitting diodes with an embedded nanoporous GaN distributed Bragg reflectors." Scientific Reports 6.1 (2016): 29138.
Strite, A. S., et al. "GaN, AlN, and InN: a review." Journal of Vacuum Science & Technology B: Microelectronics and Nanometer Structures Processing, Measurement, and Phenomena 10.4 (1992): 1237-1266.
Takai, Isamu et al. "Optical vehicle-to-vehicle communication system using LED transmitter and camera receiver." IEEE photonics journal 6.5 (2014): 1-14.
Thuau, D. et al. "A microstructure for thermal conductivity measurement of conductive thin films." Microelectronic engineering 88.8 (2011): 2408-2412.
Turin, Valentin O. et al. "Electrothermal simulation of the self-heating effects in GaN-based field-effect transistors." Journal of Applied Physics 100.5 (2006).
Vitanov, Stanislav. Simulation of high electron mobility transistors. Diss. Technische Universität Wien, 2010.
Wang, Shing-Chung et al. "Optically pumped GaN-based vertical cavity surface emitting lasers: Technology and characteristics." Japanese Journal of Applied Physics 46.8S (2007): 5397.
Watanabe, Naoki et al. "The temperature dependence of the refractive indices of GaN and AlN from room temperature up to 515° C." Journal of Applied Physics 104.10 (2008).
Watson, Scott et al. "Visible light communications using a directly modulated 422 nm GaN laser diode." Optics letters 38.19 (2013): 3792-3794.
Weng, Guoen et al. "Low threshold continuous-wave lasing of yellow-green InGaN-QD vertical-cavity surface-emitting lasers." Optics Express 24.14 (2016): 15546-15553.
Amano, Hiroshi et al. "P-type conduction in Mg-doped GaN treated with low-energy electron beam irradiation (LEEBI)." Japanese journal of applied physics 28.12A (1989): L2112.
As'adi, M. J. et al. "Thermal analysis of high-index-contrast grating (HCG)-based VCSEL." Optik 125.15 (2014): 4017-4022.
Bender, M. et al. "Dependence of oxygen flow on optical and electrical properties of DC-magnetron sputtered ITO films." Thin Solid Films 326. 1-2 (1998): 72-77.
Bernardini, Fabio et al. "Spontaneous versus piezoelectric polarization in III-V nitrides: conceptual aspects and practical consequences." physica status solidi (b) 216.1 (1999): 391-398.
Braniste, Tudor et al. "Multilayer porous structures of HVPE and MOCVD grown GaN for photonic applications." Superlattices and Microstructures 102 (2017): 221-234.
Butte, R. et al. "Current status of AlInN layers lattice-matched to GaN for photonics and electronics." Journal of Physics D: Applied Physics 40.20 (2007): 6328.
Cahill, David G. "Thermal-conductivity measurement by time-domain thermoreflectance." MRS Bulletin 43.10 (2018): 782-789.
Cao, X. A. et al. "Electrical effects of plasma damage in p-GaN." Applied physics letters 75.17 (1999): 2569-2571.
Chen, Danti et al. "Nanopores in GaN by electrochemical anodization in hydrofluoric acid: Formation and mechanism." Journal of Applied Physics 112.6 (2012).
Coldren, Larry A. et al. Diode lasers and photonic integrated circuits. vol. 218. John Wiley & Sons, 2012.
Corzine, Scott W. et al. "A tanh substitution technique for the analysis of abrupt and graded interface multilayer dielectric stacks." IEEE Journal of Quantum Electronics 27.9 (1991): 2086-2090.
Cosendey, Gatien et al. "Blue monolithic AlInN-based vertical cavity surface emitting laser diode on free-standing GaN substrate." Applied Physics Letters 101.15 (2012).
Eiting, C. J. et al. "Growth of low resistivity p-type GaN by metal organic chemical vapour deposition." Electronics Letters 33.23 (1997): 1987-1989.
Fallah, Hamid Reza et al. "The effect of annealing on structural, electrical and optical properties of nanostructured ITO films prepared by e-beam evaporation." Materials Research Bulletin 42.3 (2007): 487-496.
Farrell, R. M. et al. "Effect of carrier gas and substrate misorientation on the structural and optical properties of m-plane InGaN/GaN light-emitting diodes." Journal of crystal growth 313.1 (2010): 1-7.
Farrell, Robert M. et al. "Continuous-wave operation of AlGaN-cladding-free nonpolar m-plane InGaN/GaN laser diodes." Japanese Journal of Applied Physics 46.8L (2007): L761.
Feezell, Daniel F. "Status and future of GaN-based vertical-cavity surface-emitting lasers." Gallium Nitride Materials and Devices X. vol. 9363. SPIE, 2015.
Fujito, Kenji et al. "High-quality nonpolar m-plane GaN substrates grown by HVPE." physica status solidi (a) 205.5 (2008): 1056-1059.
Fujito, Kenji et al. "Development of bulk GaN crystals and nonpolar/semipolar substrates by HVPE." MRS bulletin 34.5 (2009): 313-317.
Furuta, Takashi et al. "Room-temperature CW operation of a nitride-based vertical-cavity surface-emitting laser using thick GaInN quantum wells." Japanese Journal of Applied Physics 55.5S (2016): 05FJ11.
Furuta, Takashi et al. "1.7-mW nitride-based vertical-cavity surface-emitting lasers using AlInN/GaN bottom DBRs." 2016 International Semiconductor Laser Conference (ISLC). IEEE, 2016.
Gerfin, Tobias et al. "Optical properties of tin-doped indium oxide determined by spectroscopic ellipsometry." Journal of applied physics 79.3 (1996): 1722-1729.
Gil, Bernard et al. "Basic Crystallography and Other Properties Linked with Symmetry." Physics of Wurtzite Nitrides and Oxides: Passport to Devices (2014): 1-48.
Hainich, Rolf R. et al. Displays: fundamentals & applications. AK Peters/CRC Press, 2016.
Hamaguchi, Tatsushi et al. "Lateral carrier confinement of GaN-based vertical-cavity surface-emitting diodes using boron ion implantation." Japanese Journal of Applied Physics 55.12 (2016): 122101.
Hamaguchi, Tatsushi et al. "Milliwatt-class GaN-based blue vertical-cavity surface-emitting lasers fabricated by epitaxial lateral overgrowth." physica status solidi (a) 213.5 (2016): 1170-1176.
Hamaguchi, Tatsushi et al. "Sub-milliampere-threshold continuous wave operation of GaN-based vertical-cavity surface-emitting laser with lateral optical confinement by curved mirror." Applied Physics Express 12.4 (2019): 044004.
Hashemi, Ehsan et al. "Engineering the lateral optical guiding in gallium nitride-based vertical-cavity surface-emitting laser cavities to reach the lowest threshold gain." Japanese Journal of Applied Physics 52.8S (2013): 08JG04.
Henry, Charles. "Theory of the linewidth of semiconductor lasers." IEEE Journal of Quantum Electronics 18.2 (1982): 259-264.
Higuchi, Yu et al. "Room-temperature CW lasing of a GaN-based vertical-cavity surface-emitting laser by current injection." Applied Physics Express 1.12 (2008): 121102.
Holder, Casey et al. "Demonstration of nonpolar GaN-based vertical-cavity surface-emitting lasers." Applied Physics Express 5.9 (2012): 092104.
Iida, Ryosuke et al. "GaN-based vertical cavity surface emitting lasers with lateral optical confinements and conducting distributed Bragg reflectors." Japanese Journal of Applied Physics 59.SG (2020): SGGE08.
Imura, Masataka et al. "High-temperature metal-organic vapor phase epitaxial growth of AlN on sapphire by multi transition growth mode method varying V/III ratio." Japanese journal of applied physics 45.11R (2006): 8639.
Iwase, Hideo et al. "Electrical properties of indium-tin oxide films deposited on nonheated substrates using a planar-magnetron sputtering system and a facing-targets sputtering system." Journal of Vacuum Science & Technology A 24.1 (2006): 65-69.
Izumi, Shouichiro et al. "Room-temperature continuous-wave operation of GaN-based vertical-cavity surface-emitting lasers fabricated using epitaxial lateral overgrowth." Applied Physics Express 8.6 (2015): 062702.
Kako, S. et al. "Observation of enhanced spontaneous emission coupling factor in nitride-based vertical-cavity surface-emitting laser." Applied physics letters 80.5 (2002): 722-724.

(56) References Cited

OTHER PUBLICATIONS

Kaneko, Satoru et al. "Epitaxial indium tin oxide film deposited on sapphire substrate by solid-source electron cyclotron resonance plasma." Japanese Journal of Applied Physics 51.1S (2012): 01AC02.

Kasahara, Daiji et al. "Demonstration of blue and green GaN-based vertical-cavity surface-emitting lasers by current injection at room temperature." Applied Physics Express 4.7 (2011): 072103.

Kaufmann, U. et al. "Hole conductivity and compensation in epitaxial GaN: Mg layers." Physical Review B 62.16 (2000): 10867.

Koleske, D. D. et al. "GaN decomposition in H2 and N2 at MOVPE temperatures and pressures." Journal of crystal growth 223.4 (2001): 466-483.

Kondo, Takashi et al. "Developments of VCSELs for printers and optical communications at Fuji Xerox." Vertical-Cavity Surface-Emitting Lasers XX. vol. 9766. SPIE, 2016.

Krzewick, Will. "Chip Scale Atomic Clocks: Effects on Timing Error—Temperature (Part 3 of 4) « Microsemi," (n.d.).

Kubota, Masashi et al. "Temperature dependence of polarized photoluminescence from nonpolar m-plane InGaN multiple quantum wells for blue laser diodes." Applied Physics Letters 92.1 (2008).

Kuramoto, M. et al. "Reduction of internal loss and threshold current in a laser diode with a ridge by selective re-growth (RiS-LD)." physica status solidi (a) 192.2 (2002): 329-334.

Kuramoto, Masaru et al. "Enhancement of slope efficiency and output power in GaN-based vertical-cavity surface-emitting lasers with a SiO2-buried lateral index guide." Applied Physics Letters 112.11 (2018).

Zhang, Cheng et al. "Mesoporous GaN for Photonic Engineering 珵 Highly Reflective GaN Mirrors as an Example." ACS photonics 2.7 (2015): 980-986.

Zhang, Y. M. et al. "Cryogenic performance of double-fused 1.5-/spl mu/m vertical cavity lasers." Journal of lightwave technology 17.3 (1999): 503-508.

Zhou, Taofei et al. "Thermal transport of nanoporous gallium nitride for photonic applications." Journal of Applied Physics 125.15 (2019).

Zhu, Tongtong et al. "Wafer-scale fabrication of non-polar mesoporous GaN distributed Bragg reflectors via electrochemical porosification." Scientific reports 7.1 (2017): 1-8.

Zou, J. et al. "Thermal conductivity of GaN films: Effects of impurities and dislocations." Journal of applied physics 92.5 (2002): 2534-2539.

Agrawal, Govind P. Fiber-optic communication systems. John Wiley & Sons, 2012.

Aschenbrenner, T. et al. "Optical and structural characterization of AlInN layers for optoelectronic applications." Journal of Applied Physics 108.6 (2010).

Bellanger, Mathieu et al. "Highly reflective GaN-based air-gap distributed Bragg reflectors fabricated using AlInN wet etching." Applied Physics Express 2.12 (2009): 121003.

Braun, Matthew M. et al. "Effective optical properties of non-absorbing nanoporous thin films." Thin Solid Films 496.2 (2006): 505-514.

Brinkley, Stuart E. et al. "Polarized spontaneous emission from blue-green m-plane GaN-based light emitting diodes." Applied Physics Letters 98.1 (2011).

Cahill, David G. "Analysis of heat flow in layered structures for time-domain thermoreflectance." Review of scientific instruments 75.12 (2004): 5119-5122.

Caro Bayo, Miguel Ángel. "Theory of elasticity and electric polarization effects in the group-III nitrides." (2013).

Chang, Tsu-Chi et al. "High-temperature operation of GaN-based vertical-cavity surface-emitting lasers." Applied Physics Express 10.11 (2017): 112101.

Chichibu, Shigefusa F. et al. "Origin of defect-insensitive emission probability in In-containing (Al, In, Ga) N alloy semiconductors." Nature materials 5.10 (2006): 810-816.

Chow, Weng W. et al. "Analysis of lasers as a solution to efficiency droop in solid-state lighting." Applied Physics Letters 107.14 (2015).

Chu, Jung-Tang et al. "Room-temperature operation of optically pumped blue-violet GaN-based vertical-cavity surface-emitting lasers fabricated by laser lift-off." Japanese journal of applied physics 45.4R (2006): 2556.

Chu, Jung-Tang et al. "Emission characteristics of optically pumped GaN-based vertical-cavity surface-emitting lasers." Applied physics letters 89.12 (2006).

Denault, Kristin A. et al. "Efficient and stable laser-driven white lighting." Aip Advances 3.7 (2013).

Fan, Feng-Hsu et al. "Ultraviolet GaN light-emitting diodes with porous-AlGaN reflectors." Scientific reports 7.1 (2017): 4968.

Farrell, R. M. et al. "Determination of internal parameters for AlGaN-cladding-free m-plane InGaN/GaN laser diodes." Applied Physics Letters 99.17 (2011).

Farrell, R. M. et al. "Origin of pyramidal hillocks on GaN thin films grown on free-standing m-plane GaN substrates." Applied Physics Letters 96.23 (2010).

Feezell, Daniel et al. "Invention, development, and status of the blue light-emitting diode, the enabler of solid-state lighting." Comptes Rendus Physique 19.3 (2018): 113-133.

Feezell, Daniel et al. "Optical design of InAlGaAs low-loss tunnel-junction apertures for long-wavelength vertical-cavity lasers." IEEE journal of quantum electronics 42.5 (2006): 494-499.

Feltin, E. et al. "Blue lasing at room temperature in an optically pumped lattice-matched AlInN/GaN VCSEL structure." Electronics Letters 43.17 (2007): 924-926.

Forman, Charles A. et al. "Continuous-wave operation of m-plane GaN-based vertical-cavity surface-emitting lasers with a tunnel junction intracavity contact." Applied Physics Letters 112.11 (2018).

Gao, Yan et al. "Dislocation-and crystallographic-dependent photoelectrochemical wet etching of gallium nitride." Applied physics letters 84.17 (2004): 3322-3324.

Goncalves, G. et al. "Influence of post-annealing temperature on the properties exhibited by ITO, IZO and GZO thin films." Thin solid films 515.24 (2007): 8562-8566.

Griffin, Peter et al. "Porous AlGaN-based ultraviolet distributed Bragg reflectors." Materials 11.9 (2018): 1487.

Haberer, E. D. et al. "Enhanced diffusion as a mechanism for ion-induced damage propagation in GaN." Journal of Vacuum Science & Technology B: Microelectronics and Nanometer Structures Processing, Measurement, and Phenomena 19.3 (2001): 603-608.

Hamaguchi, Tatsushi et al. "Lateral optical confinement of GaN-based VCSEL using an atomically smooth monolithic curved mirror." Scientific Reports 8.1 (2018): 10350.

Hayashi, Natsumi et al. "A GaN-Based VCSEL with a Convex Structure for Optical Guiding." physica status solidi (a) 215.10 (2018): 1700648.

Hegblom, Eric R. et al. "Scattering losses from dielectric apertures in vertical-cavity lasers." IEEE Journal of Selected Topics in Quantum Electronics 3.2 (1997): 379-389.

Hirai, A. et al. "Formation and reduction of pyramidal hillocks on m-plane {11 00} GaN." Applied Physics Letters 91.19 (2007).

Holder, C. O. et al. "Nonpolar III-nitride vertical-cavity surface emitting lasers with a polarization ratio of 100% fabricated using photoelectrochemical etching." Applied Physics Letters 105.3 (2014).

Hsieh, D. H. et al. "Improved carrier injection in GaN-based VCSEL via AlGaN/GaN multiple quantum barrier electron blocking layer." Optics Express 23.21 (2015): 27145-27151.

Iga, Kenichi. "Surface-emitting laser-its birth and generation of new optoelectronics field." IEEE Journal of selected topics in Quantum Electronics 6.6 (2000): 1201-1215.

Kamatagi, M. D. et al. "Thermal conductivity of GaN." Diamond and related materials 16.1 (2007): 98-106.

Kearns, Jared A. et al. "Demonstration of blue semipolar (202 1) GaN-based vertical-cavity surface-emitting lasers." Optics express 27.17 (2019): 23707-23713.

Kelchner, K. M. et al. "Stable vicinal step orientations in m-plane GaN." Journal of Crystal Growth 411 (2015): 56-62.

Kerkache, L. et al. "Physical properties of RF sputtered ITO thin films and annealing effect." Journal of Physics D: Applied Physics 39.1 (2005): 184.

(56) References Cited

OTHER PUBLICATIONS

Kiopakis, Emmanouil et al. "Determination of internal loss in nitride lasers from first principles." Applied physics express 3.8 (2010): 082101.
Kiopakis, Emmanouil et al. "Indirect Auger recombination as a cause of efficiency droop in nitride light-emitting diodes." Applied Physics Letters 98.16 (2011).
Klootwijk, J. H. et al. "Merits and limitations of circular TLM structures for contact resistance determination for novel III-V HBTs." Proceedings of the 2004 International Conference on Microelectronic Test Structures (IEEE Cat. No. 04CH37516). IEEE, 2004.
Kubota, Eishi et al. "Effects of magnetic field gradient on crystallographic properties in tin-doped indium oxide films deposited by electron cyclotron resonance plasma sputtering." Japanese journal of applied physics 33.9R (1994): 4997.
Kuramoto, Masaru et al. "High-output-power and high-temperature operation of blue GaN-based vertical-cavity surface-emitting laser." Applied Physics Express 11.11 (2018): 112101.
Kuramoto, Masaru et al. "High-power GaN-based vertical-cavity surface-emitting lasers with AlInN/GaN distributed Bragg reflectors." Applied Sciences 9.3 (2019): 416.
Kuramoto, Masaru et al. "Watt-class blue vertical-cavity surface-emitting laser arrays." Applied Physics Express 12.9 (2019): 091004.
Lacroute, Clément et al. "Compact Yb+ optical atomic clock project: design principle and current status." Journal of Physics: Conference Series. vol. 723. No. 1. IOP Publishing, 2016.
Lee, Seung-Min et al. "Optically pumped GaN vertical cavity surface emitting laser with high index-contrast nanoporous distributed Bragg reflector." Optics express 23.9 (2015): 11023-11030.
Lee, SeungGeun et al. "Demonstration of GaN-based vertical-cavity surface-emitting lasers with buried tunnel junction contacts." Optics Express 27.22 (2019): 31621-31628.
Lee, Changmin et al. "2 Gbit/s data transmission from an unfiltered laser-based phosphor-converted white lighting communication system." Optics express 23.23 (2015): 29779-29787.
Lee, Changmin et al. "4 Gbps direct modulation of 450 nm GaN laser for high-speed visible light communication." Optics express 23.12 (2015): 16232-16237.
Lee, SeungGeun et al. "GaN-based vertical-cavity surface-emitting lasers with tunnel junction contacts grown by metal-organic chemical vapor deposition." Applied Physics Express 11.6 (2018): 062703.
Leonard, J. T. et al. "Nonpolar III-nitride vertical-cavity surface-emitting lasers incorporating an ion implanted aperture." Applied Physics Letters 107.1 (2015).
Leonard, J. T., et al."Demonstration of a III-nitride vertical-cavity surface-emitting laser with a III-nitride tunnel junction intracavity contact." Applied Physics Letters 107.9 (2015).
Lee, SeungGeun et al. "Smooth and selective photo-electrochemical etching of heavily doped GaN: Si using a mode-locked 355 nm microchip laser." Applied Physics Express 10.1 (2016): 011001.
Lester, L. F. et al. "Nonalloyed Ti/Al ohmic contacts to n-type GaN using high-temperature premetallization anneal." Applied physics letters 69.18 (1996): 2737-2739.
Li, Z. Q. et al. "Simulations of laser diodes with nonpolar InGaN multi-quantum-wells." physica status solidi c 7.7-8 (2010): 2259-2261.
Lu, Bo et al. "High temperature pulsed and continuous-wave operation and thermally stable threshold characteristics of vertical-cavity surface-emitting lasers grown by metalorganic chemical vapor deposition." Applied physics letters 65.11 (1994): 1337-1339.
Meneghini, Matteo et al. "Electrical properties, reliability issues, and ESD robustness of InGaN-based LEDs." III-Nitride Based Light Emitting Diodes and Applications (2013): 197-229.
Mishkat-Ul-Masabih, Saadat et al. "Techniques to reduce thermal resistance in flip-chip GaN-based VCSELs." physica status solidi (a) 214.8 (2017): 1600819.
Mishkat-Ul-Masabih, Saadat et al. "Optically Pumped Polarization-Pinned GaN-Based Vertical-Cavity Surface-Emitting Lasers using Nanoporous Distributed Bragg Reflectors." 2018 IEEE International Semiconductor Laser Conference (ISLC). IEEE, 2018.
Mogg, Sebastian et al. "Temperature sensitivity of the threshold current of long-wavelength InGaAs-GaAs VCSELs with large gain-cavity detuning." IEEE Journal of Quantum Electronics 40.5 (2004): 453-462.
Monavarian, Morteza et al. "A Decade of Nonpolar and Semipolar III-Nitrides: A Review of Successes and Challenges." physica status solidi (a) 216.1 (2019): 1800628.
Mokoc, H. "Nitride Semiconductors and Devices" (Springer Science & Business Media, 2013).
Mukoyama, Naotaka et al. "VCSEL array-based light exposure system for laser printing." Vertical-Cavity Surface-Emitting Lasers XII. vol. 6908. SPIE, 2008.
National Aeronautics, ed. NASA's journey to Mars: pioneering next steps in space exploration. Government Printing Office, 2016.
Najda, S. P. et al. "A multi-wavelength (uv to visible) laser system for early detection of oral cancer." Imaging, Manipulation, and Analysis of Biomolecules, Cells, and Tissues XIII. vol. 9328. SPIE, 2015.
Nagel, Henning et al. "Optimised antireflection coatings for planar silicon solar cells using remote PECVD silicon nitride and porous silicon dioxide." Progress in Photovoltaics: Research and Applications 7.4 (1999): 245-260.
Nash, F. R. "Mode guidance parallel to the junction plane of double-heterostructure GaAs lasers." Journal of Applied Physics 44.10 (1973): 4696-4707.
Omae, Kunimichi et al. "Improvement in lasing characteristics of GaN-based vertical-cavity surface-emitting lasers fabricated using a GaN substrate." Applied Physics Express 2.5 (2009): 052101.
Onishi, Toshikazu et al. "Continuous wave operation of GaN vertical cavity surface emitting lasers at room temperature." IEEE Journal of Quantum Electronics 48.9 (2012): 1107-1112.
Osinski, M. et al. "Effective thermal conductivity analysis of 1.55 mu m InGaAsP/InP vertical-cavity top-surface-emitting microlasers." Electronics Letters 11.29 (1993): 1015-1016.
Panjehpour, Masoud et al. "Laser-induced fluorescence spectroscopy for in vivo diagnosis of non-melanoma skin cancers." Lasers in Surgery and Medicine: The Official Journal of the American Society for Laser Medicine and Surgery 31.5 (2002): 367-373.
Park, Seoung-Hwan. "Crystal orientation effects on electronic properties of wurtzite InGaN/GaN quantum wells." Journal of applied physics 91.12 (2002): 9904-9908.
Park, Seoung-Hwan. "Piezoelectric and spontaneous polarization effects on many-body optical gain of wurtzite InGaN/GaN quantum well with arbitrary crystal orientation." Japanese journal of applied physics 42.8R (2003): 5052.
Park, Seoung-Hwan. "Crystal orientation effects on many-body optical gain of wurtzite InGaN/GaN quantum well lasers." Japanese journal of applied physics 42.2B (2003): L170.
Park, Seoung-Hwan et al. "Electronic and optical properties of ${\rm a}$-and ${\rm m}$-plane wurtzite InGaN-GaN quantum wells." IEEE Journal of Quantum Electronics 43.12 (2007): 1175-1182.
Park, Joonmo et al."Doping selective lateral electrochemical etching of GaN for chemical lift-off." Applied physics letters 94.22 (2009).
Park, Joonmo et al. "High diffuse reflectivity of nanoporous GaN distributed Bragg reflector formed by electrochemical etching." Applied Physics Express 6.7 (2013): 072201.
Piprek, Joachim. "High-temperature lasing of long-wavelength VCSELs: problems and prospects." Vertical-Cavity Surface-Emitting Lasers. vol. 3003. SPIE, 1997.
Polyanskiy, M. N. "Refractive index database," https://refractiveindex.info (2019).
Ponce, F. A. et al. "Nitride-based semiconductors for blue and green light-emitting devices." nature 386.6623 (1997): 351-359.
Rashidi, Arman et al. "Nonpolar ${m}$-plane InGaN/GaN microscale light-emitting diode with 1.5 GHz modulation bandwidth." IEEE Electron Device Letters 39.4 (2018): 520-523.
Redwing, Joan M. et al. "An optically pumped GaN-AlGaN vertical cavity surface emitting laser." Applied Physics Letters 69.1 (1996): 1-3.

(56) References Cited

OTHER PUBLICATIONS

Ryu, H. Y. et al. "Determination of internal parameters in blue InGaN laser diodes by the measurement of cavity-length dependent characteristics." Applied Physics Letters 93.1 (2008).
Sarua, Andrei et al. "Thermal boundary resistance between GaN and substrate in AlGaN/GaN electronic devices." IEEE Transactions on electron devices 54.12 (2007): 3152-3158.
Schade, L. et al. "Impact of band structure and transition matrix elements on polarization properties of the photoluminescence of semipolar and nonpolar InGaN quantum wells." physica status solidi (b) 248.3 (2011): 638-646.
Scheibenzuber, W. G. et al. "Polarization switching of the optical gain in semipolar InGaN quantum wells." physica status solidi (b) 248.3 (2011): 647-651.
Schroder, Dieter K. Semiconductor material and device characterization. John Wiley & Sons, 2015.
Schubert E. F. "Light-Emitting Diodes," in Wiley Encyclopedia of Electrical and Electronics Engineering (American Cancer Society, 2014), pp. 1-10.
Schwab, Mark J. et al. "Aligned mesopore arrays in GaN by anodic etching and photoelectrochemical surface etching." The Journal of Physical Chemistry C 117.33 (2013): 16890-16895.
Shen, Chao et al. "GHz modulation bandwidth from single-longitudinal mode violet-blue VCSEL using nonpolar InGaN/GaN QWs." 2016 Conference on Lasers and Electro-Optics (CLEO). IEEE, 2016.
Shieh, Bing-Cheng et al. "InGaN light-emitting diodes with embedded nanoporous GaN distributed Bragg reflectors." Applied Physics Express 8.8 (2015): 082101.
Sikdar, D. et al. "Optical nanoantennas set the stage for a NEMS lab-ona-chip revolution." J. Appl. Phys (2015).
Sizov, Dmitry et al. "Optical absorption of Mg-doped layers and InGaN quantum wells on c-plane and semipolar GaN structures." Journal of Applied Physics 113.20 (2013).
Soda, Haruhisa et al. "GaInAsP/InP surface emitting injection lasers." Japanese Journal of Applied Physics 18.12 (1979): 2329.
Synowicki, R. A. "Spectroscopic ellipsometry characterization of indium tin oxide film microstructure and optical constants." Thin Solid Films 313 (1998): 394-397.
Takeuchi, Tetsuya et al. "GaN-based vertical-cavity surface-emitting lasers with AlInN/GaN distributed Bragg reflectors." Reports on Progress in Physics 82.1 (2018): 012502.
Tao, Renchun et al. "Strong coupling in non-polar GaN/AlGaN microcavities with air-gap/III-nitride distributed Bragg reflectors." Applied Physics Letters 107.10 (2015).
Tatum, J. A. "Evolution of VCSELs," in SPIE OPTO, J. K. Guenter and C. Lei, eds. (2014), p. 90010C.
Tseng, W. J. et al. "Anodic etching of n-GaN epilayer into porous GaN and its photoelectrochemical properties." The Journal of Physical Chemistry C 118.51 (2014): 29492-29498.
Tsujimura, Hiroki et al. "Characteristics of polarized electroluminescence from m-plane InGaN-based light emitting diodes." Japanese Journal of Applied Physics 46.11L (2007): L1010.
Ueki, Nobuaki et al. "VCSEL-based laser printing system." VCSELs: Fundamentals, Technology and Applications of Vertical-Cavity Surface-Emitting Lasers. Berlin, Heidelberg: Springer Berlin Heidelberg, 2012. 539-548.

Vo-Dinh, Tuan et al. "In vivo cancer diagnosis of the esophagus using differential normalized fluorescence (DNF) indices." Lasers in surgery and medicine 16.1 (1995): 41-47.
Wang, Guan-Jhong et al. "GaN/AlGaN ultraviolet light-emitting diode with an embedded porous-AlGaN distributed Bragg reflector." Applied Physics Express 10.12 (2017): 122102.
WIERER Jr, Jonathan J. et al. "Advantages of III-nitride laser diodes in solid-state lighting." physica status solidi (a) 212.5 (2015): 980-985.
Yang, Xiaokun et al. "Fabrication, annealing, and regrowth of wafer-scale nanoporous GaN distributed Bragg reflectors." Scripta Materialia 156 (2018): 10-13.
Xu, Rongbin et al. "Green vertical-cavity surface-emitting lasers based on combination of blue-emitting quantum wells and cavity-enhanced recombination." IEEE Transactions on Electron Devices 65.10 (2018): 4401-4406.
Yamada, Hisashi et al. "Impact of substrate miscut on the characteristic of m-plane InGaN/GaN light emitting diodes." Japanese Journal of Applied Physics 46.12L (2007): L1117.
Yamamoto, Y. et al. "Microcavity semiconductor laser with enhanced spontaneous emission." Physical Review A 44.1 (1991): 657.
Yamamoto, A. et al. "Growth temperature dependences of MOVPE InN on sapphire substrates." physica status solidi (b) 228.1 (2001): 5-8.
Yang, Chao et al. "GaN with laterally aligned nanopores to enhance the water splitting." The Journal of Physical Chemistry C 121.13 (2017): 7331-7336.
Yu, Hsin-chieh et al. "Progress and prospects of GaN-based VCSEL from near UV to green emission." Progress in Quantum Electronics 57 (2018): 1-19.
Zhang, Yu et al. "A conductivity-based selective etching for next generation GaN devices." physica status solidi (b) 247.7 (2010): 1713-1716.
Zhang, Cheng et al. "New directions in GaN photonics enabled by electrochemical processes." ECS Transactions 72.5 (2016): 47.
Zhang, Cheng et al. "A resonant-cavity blue-violet light-emitting diode with conductive nanoporous distributed Bragg reflector." physica status solidi (a) 214.8 (2017): 1600866.
Zhang, Cheng et al. "Toward quantitative electrochemical nanomachining of III-nitrides." Journal of The Electrochemical Society 165.10 (2018): E513.
Farrell, Robert Michael. Growth, Fabrication, and Characterization of Continuous-Wave Aluminum Gallium Nitride-Cladding-Free m-plane Indium Gallium Nitride/Gallium Nitride Laser Diodes. Diss. University of California, Santa Barbara, 2010.
Piprek, Joachim, ed. Nitride semiconductor devices: principles and simulation. John Wiley & Sons, 2007.
"The tick-tock of the optical clock," https://phys.org/news/2012-03-tick-tock-opticalclock.html.
Miskkat-Ul-Msabih, Saadat et al., "Effect of Mask Orientation and Growth Parameters on the Epitaxial Lateral Overgrowth of GaN on Free-Standing Nonpolar Substrates," in 21st American Conference on Crystal Growth and Epitaxy (2017), Abstract.
Matsui, K. et al., "3-mW RT-CW GaN-Based VCSELs and Their Temperature Dependence," presented at the International Workshop on Nitride Semiconductors, Orlando, USA, Oct. 2-7, 2016.

* cited by examiner

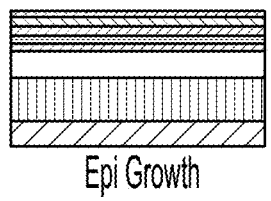
Epi Growth
FIG. 4A
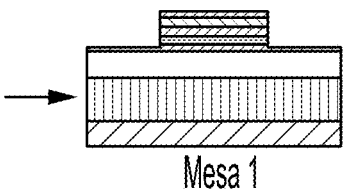
Mesa 1
FIG. 4B
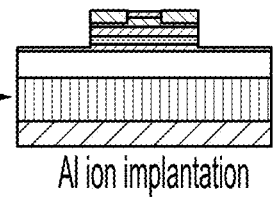
Al ion implantation
FIG. 4C
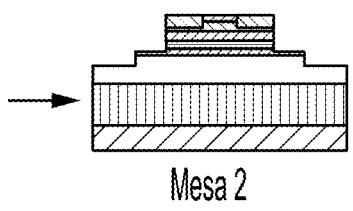
Mesa 2
FIG. 4D
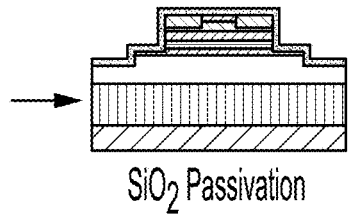
SiO₂ Passivation
FIG. 4E
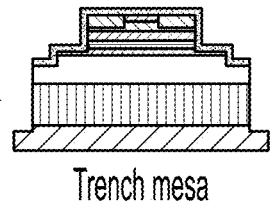
Trench mesa
FIG. 4F
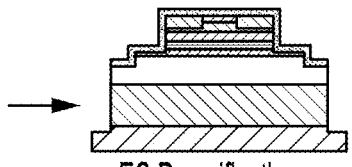
EC Porosification
FIG. 4G
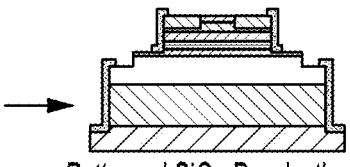
Patterned SiO₂ Passivation
FIG. 4H
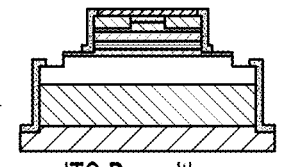
ITO Deposition
FIG. 4I
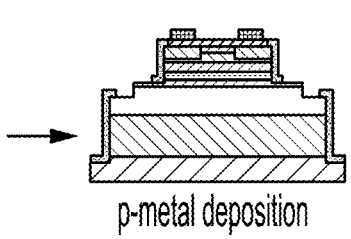
p-metal deposition
FIG. 4J
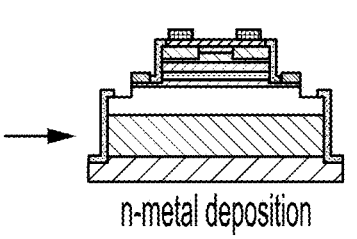
n-metal deposition
FIG. 4K
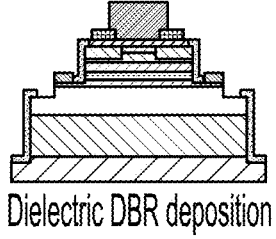
Dielectric DBR deposition
FIG. 4L
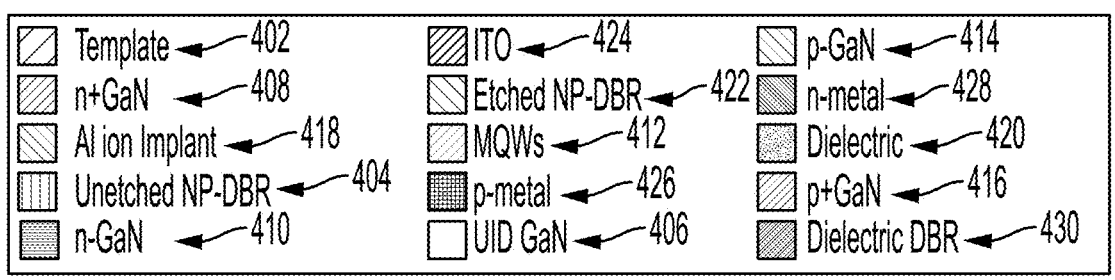

Near-field

Mode simulation

Near-field

Mode simulation

NON-C-PLANE GROUP III-NITRIDE-BASED VCSELs WITH NANOPOROUS DISTRIBUTED BRAGG REFLECTOR MIRRORS

CROSS REFERENCE TO RELATED APPLICATIONS

This application claims priority to U.S. Provisional Patent Application No. 62/981,300 filed on Feb. 25, 2020, the disclosure of which is hereby incorporated by reference in its entirety.

GOVERNMENT RIGHTS

This disclosure was made with Government support under Grant No. 1454691 awarded by the National Science Foundation. The Government has certain rights in the invention.

FIELD

This disclosure relates generally to non-c-plane Group III-nitride-based VCSELs with nanoporous distributed Bragg reflector mirrors.

BACKGROUND

GaN-based vertical-cavity surface-emitting lasers (VCSELs) have drawn interest in recent years for their potential applications in data storage, laser printing, solid-state lighting, optical communications, sensing, and displays. Several research groups have demonstrated electrically injected GaN-based VCSELs utilizing different growth and fabrication techniques to address the many challenges associated with III-nitride materials. One such challenge is fabrication of high-quality conductive epitaxial distributed Bragg reflectors (DBRs).

With the commercialization of light emitting diodes (LEDs) and edge-emitting lasers diodes (LDs) in the violet-blue spectral region, group III-nitride based optoelectronic devices have undergone significant advancements in terms of device performance and reliability. As such, many lighting, communication, data storage, display, and sensing applications now utilize GaN-based light emitters. Among these light emitters, vertical-cavity surface-emitting lasers (VCSELs) have garnered much attention in recent years due to their inherent advantages over edge-emitting lasers. The significantly shorter cavity lengths in VCSELs often allow for single-longitudinal-mode operation, while a small aperture diameter also enables single-transverse-mode operation in some cases. Furthermore, the small device size allows the fabrication of high-density 2D arrays, thereby dramatically reducing the development cost per device. Unlike edge-emitters, the emission of VCSELs is normal to the device surface and has a circular beam profile with low divergence angle, thus VCSELs are highly efficient for fiber coupling and on-wafer testing. Similarly, the small cavity volume results in fundamentally low threshold current and high modulation bandwidth at low bias currents. III-nitride VCSELs are typically fabricated on the polar c-plane orientation that suffers from polarization-related electric fields in the active region and low per-pass gain. However, the nonpolar m-plane orientation eliminates internal electric fields, causing the uniform overlap of the electron and hole wave functions. Additionally, the in-plane gain anisotropy in the nonpolar orientation enables polarization-pinned emission along the a-direction, which is often desired in applications such as polarization-pinned arrays or atomic clocks.

Optically and electrically pumped GaN-based VCSELs have been demonstrated by many research groups in the past decade. One challenge for GaN-based VCSELs is the absence of high quality, high reflectance epitaxial DBRs. Since a DBR consists of layers of alternating material, it is necessary that the two materials are lattice-matched to prevent the formation of dislocations. Only $Al_{0.82}In_{0.18}N$ can be lattice-matched to GaN, but the refractive index difference between the layers is only ~0.2, requiring more than 40-pairs to obtain a peak reflectance >99.9%. Thus, very long growth times in metal organic chemical vapor deposition (MOCVD) are necessary (~8 hours for 40-pairs) and maintaining the proper ternary alloy composition in the group-III elements is very difficult. Dielectric DBRs are often used in III-nitride VCSELs as a substitute for epitaxial DBRs due to the wide variety of materials available permitting high index contrast and ease of deposition processes. However, the use of dielectric DBRs involves complex fabrication techniques to access the backside of the cavity and device yield per wafer may be low. The non-conductive nature of dielectric materials also causes poor thermal and electrical performance of the VCSELs.

SUMMARY

According to examples of the present disclosure, an electrically injected III-nitride vertical-cavity surface emitting laser (VCSEL) is disclosed. The electrically injected III-nitride VCSEL comprises a non-c-plane substrate and a nanoporous bottom distributed Bragg reflector (DBR) comprising a plurality of alternating highly doped III-nitride layers and unintentionally doped III-nitride layers formed above the substrate.

Various additional features can be included in the electrically injected III-nitride VCSEL including one or more of the following features. An index of refraction of the highly doped III-nitride layers is controlled by an amount of porosity in the highly doped III-nitride layers, wherein the porosity comprises a plurality of subwavelength air voids. A pore size of the plurality of subwavelength air voids is determined based on an electrochemical etch bias voltage, a doping level, and an etchant solution. A density of the plurality of subwavelength air voids (porosity) is between about 20% and about 80%, or about 30% and about 70%, or about 40% and about 60%, or about 50%. The density of the plurality of subwavelength air voids is controlled based on a concentration of Si-doping. A higher density of the plurality of subwavelength air voids is inversely proportional to a number of layers of the plurality of alternating highly doped III-nitride layers and unintentionally doped III-nitride layers to obtain high mirror reflectance. The highly doped III-nitride layers and the unintentionally doped III-nitride layers can comprise GaN, $In_xGa_{1-x}N$, or $Al_xGa_{1-x}N$. The non-c-plane III-nitride substrate is an m-plane III-nitride substrate. The non-c-plane III-nitride substrate is at an angle between a c-plane and an m-plane of the III-nitride substrate. A majority of radiation emitted by the VCSEL has its electric field polarization pinned along an a-direction or perpendicular to the projection of the c-axis of the non-c-plane III-nitride substrate. An electric field of emitted radiation is polarized along an a-direction or perpendicular to the projection of the c-axis. The radiation comprises UV, visible, or infrared. The electrically injected III-nitride VCSEL further comprises a dielectric DBR formed over the nanoporous bottom distributed DBR. The substrate comprises a III-nitride material. The electrically injected III-nitride VCSEL further comprises an unintentionally doped (UID) GaN heat spreading layer; an n+GaN contact layer; an n–GaN cladding layer; an active region; an electron blocking layer; a p–GaN cladding layer; an p+GaN contact layer; an indium tin oxide (ITO) layer; a cavity spacer; and a top DBR. The electrically injected III-nitride VCSEL further comprises one or more ion-implanted apertures. In some examples, a tunnel junction can be used in place of the ITO layer.

According to examples of the present disclosure, a method for fabricating an electrically injected III-nitride vertical-cavity surface emitting laser (VCSEL) is disclosed. The method comprises providing an epitaxial structure comprising, a non-c-plane substrate, a bottom nanoporous distributed Bragg reflector (DBR) comprising a plurality of alternating highly doped III-nitride layers and unintentionally doped III-nitride layers on the substrate, a UID III-nitride heat spreading layer, an n+ III-nitride contact layer, an n– III-nitride cladding layer, an active region, an electron blocking layer, a p– III-nitride cladding layer, and a p+ III-nitride contact layer; etching a mesa to expose the n+ III-nitride contact layer; patterning to define one or more current apertures; ion implanting one or more apertures; depositing a layer of $SiO_2$ to protect the active region and contact layers; etching deep trenches to expose sidewalls of the bottom DBR structure; and etching to selectively porosify the highly doped III-nitride layers to form a nanoporous DBR.

Various additional features can be included in the method of fabricating the electrically injected III-nitride VCSEL including one or more of the following features. The method further comprises removing the layer of $SiO_2$; patterning a layer of $SiN_x$ on the mesa and the trench to passivate sidewalls of the active region and the nanoporous DBR; depositing an ITO layer; deposing an n metal and a p metal; depositing a cavity spacer; and deposing a top dielectric DBR. The substrate is a non-c-plane orientation. The substrate is at an angle between a c-plane and an m-plane of the substrate, including the m-plane or angles beyond the m-plane to minus c-plane (N face).

According to examples of the present disclosure, an electrically injected nonpolar vertical-cavity surface emitting laser (VCSEL) is disclosed. The electrically injected nonpolar VCSEL comprises an m-plane III-nitride substrate; and a lattice-matched nanoporous bottom distributed Bragg reflector (DBR) comprising a plurality of alternating highly doped III-nitride layers and unintentionally doped III-nitride layers on the substrate, wherein an index of refraction of the highly doped III-nitride layers is controlled by a plurality of subwavelength air voids.

Various additional features can be included in the electrically injected nonpolar VCSEL including one or more of the following features. The highly doped III-nitride layers and unintentionally doped III-nitride layers comprise GaN. The electrically injected nonpolar VCSEL can further comprise a UID GaN layer; an n+GaN contact layer; an n–GaN cladding layer; an active region; an electron blocking layer; a p–GaN cladding layer; an p+GaN contact layer; an ITO layer; a cavity spacer; and a top DBR. The electrically injected nonpolar VCSEL can further comprise one or more ion-implanted apertures.

According to examples of the present disclosure, a method for fabricating an electrically injected nonpolar vertical-cavity surface emitting laser (VCSEL) is disclosed. The method comprises providing an epitaxial structure comprising, an m-plane GaN substrate, a bottom distributed Bragg reflector (DBR) comprising a plurality of alternating highly doped GaN layers and unintentionally doped GaN layers on the substrate, a UID GaN heat spreading layer, an n+GaN contact layer, an n–GaN cladding layer, an active region, an electron blocking layer, a p–GaN cladding layer, and an p+GaN contact layer; etching a mesa to expose the n+GaN contact layer; patterning to define one or more current apertures; ion implanting one or more apertures; depositing a layer of $SiO_2$ to protect the active region and contact layers; etching deep trenches to expose sidewalls of the lattice-matched bottom DBR; and etching to selectively porosify the highly doped GaN layers to form a nanoporous DBR.

Various additional features can be included in the method for fabricating the electrically injected nonpolar VCSEL including one or more of the following features. The method can further comprise removing the layer of $SiO_2$; patterning a layer of $SiN_x$ on the mesa and the trench to passivate sidewalls of the active region and the nanoporous DBR; depositing an ITO layer; deposing an n metal and a p metal; depositing a cavity spacer; and deposing a top dielectric DBR.

BRIEF DESCRIPTION OF THE FIGURES

Various features of the embodiments can be more fully appreciated, as the same become better understood with reference to the following detailed description of the embodiments when considered in connection with the accompanying figures, in which:

FIG. 1A shows a polar example, FIG. 1B shows a nonpolar example, FIG. 1C show a plot of intensity vs. wavelength for different polarizations, and FIG. 1D shows a polar plot of the emission intensity from an m-plane VCSEL.

FIGS. 4A-4L show processing steps for the fabrication of the m-plane nanoporous VCSEL.

DETAILED DESCRIPTION

Figure 1A:
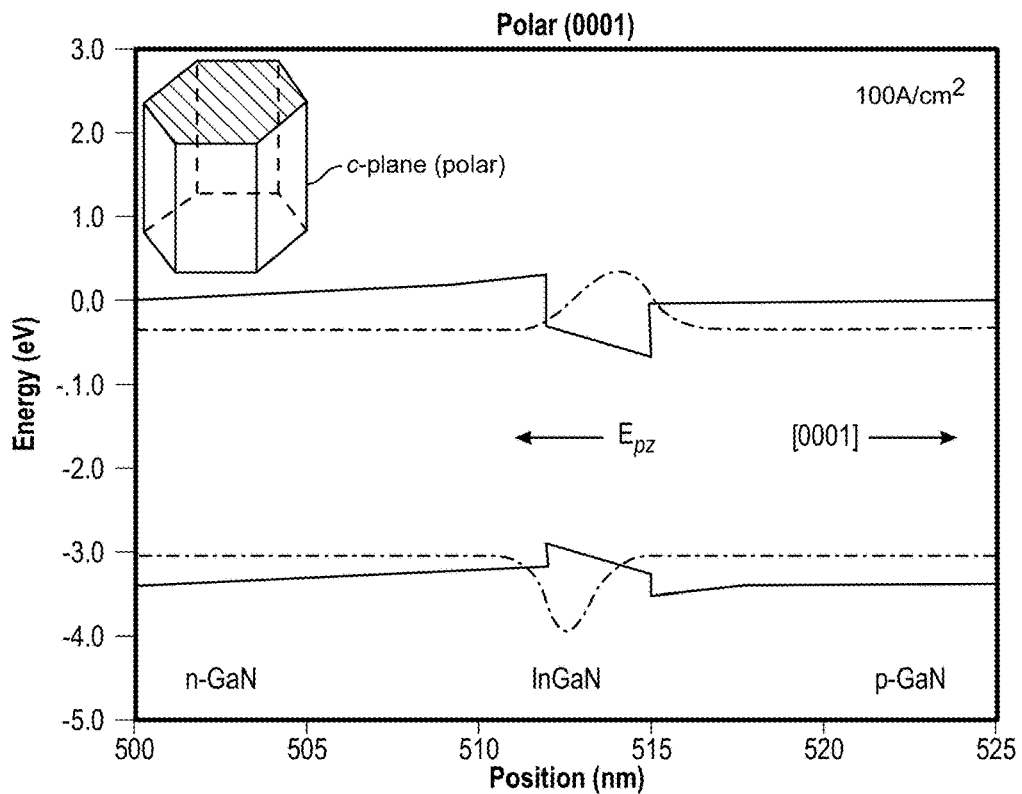
FIG. 1A, FIG. 1B, FIG. 1C, and FIG. 1D are prior art and show polar and nonpolar crystal characteristics, where

Reference will now be made in detail to example implementations, illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Generally speaking, an electrically injected vertical-cavity surface emitting laser (VCSEL) and a method of manufacturing the same is disclosed. The electrically injected VCSEL includes a non-c-plane substrate and an epitaxial nanoporous bottom distributed Bragg reflector (DBR) comprising a plurality of alternating highly doped III-nitride layers and unintentionally doped III-nitride layers formed above the substrate. The non-c-plane III-nitride substrate is at an angle between a c-plane and an m-plane of the III-nitride substrate, including the m-plane or anything beyond the m-plane to minus c-plane (N face). The highly doped III-nitride layers and the unintentionally doped III-nitride layers can comprise GaN, $In_xGa_{1-x}N$, or $Al_xGa_{1-x}N$. Other group III materials can also be used.

The index of refraction of the highly doped III-nitride layers is controlled by an amount of porosity in the highly doped III-nitride layers, wherein the porosity comprises a plurality of subwavelength air voids. A pore size of the subwavelength air voids is determined based on an electrochemical etch bias voltage, a doping level, and an etchant solution. A density of the plurality of subwavelength air voids is between about 20% and about 80%, or about 30% and about 70%, or about 40% and about 60%, or about 50%. The density of the plurality of subwavelength air voids is controlled based on a concentration of Si-doping. The porosity of the subwavelength air voids (complete etching at 100% porosity also viable) is inversely proportional to a number of pairs of alternating highly doped III-nitride and unintentionally doped III-nitride layers needed to obtain high mirror reflectance.

In some examples, a majority, such as greater than 50%, greater than 75%, greater than 90%, of radiation emitted by the VCSEL is polarization-pinned along an a-direction of the non-c-plane III-nitride substrate. An electric field of the emitted radiation is polarized along an a-direction. The radiation comprises UV, visible, or infrared. The electrically injected III-nitride VCSEL further comprises a dielectric DBR formed over the epi-layers and the nanoporous bottom DBR. The substrate comprises a III-nitride material. The electrically injected III-nitride VCSEL further comprises an unintentionally doped (UID) GaN heat spreading layer; an n+GaN contact layer; an n–GaN cladding layer; an active region; an electron blocking layer; a p–GaN cladding layer; an p+GaN contact layer; an indium tin oxide (ITO) layer; a cavity spacer; and a top dielectric DBR. The electrically injected III-nitride VCSEL further comprises one or more ion-implanted apertures.

Figure 1B:
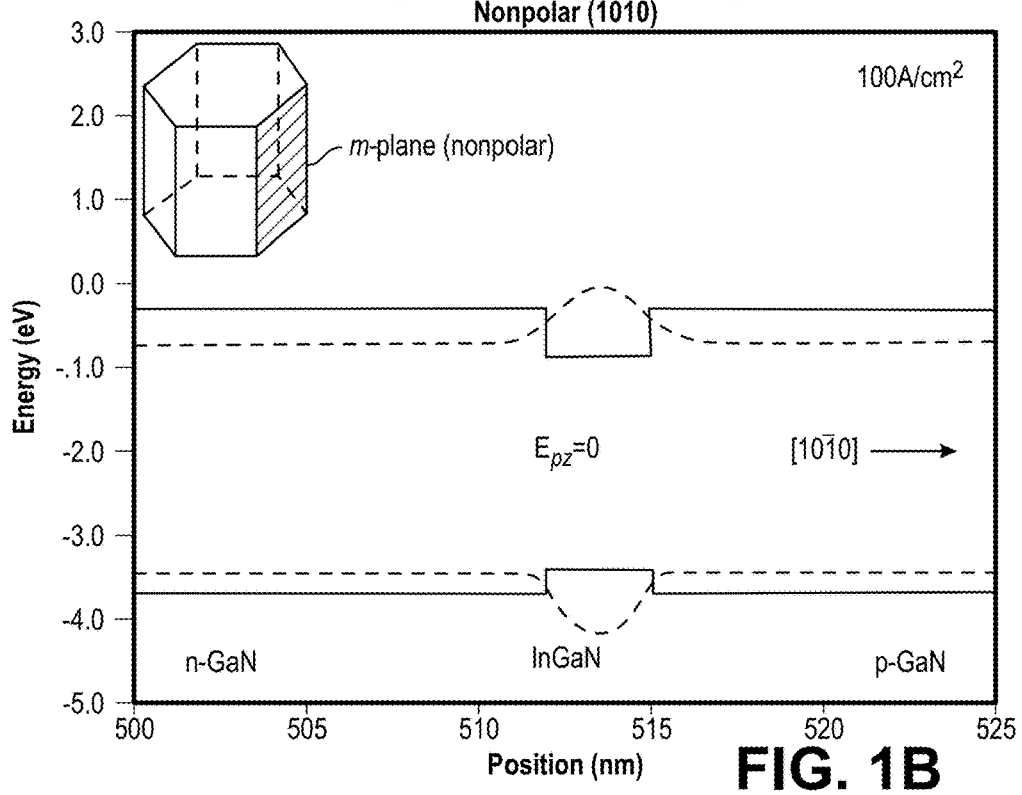
Figure 1C:
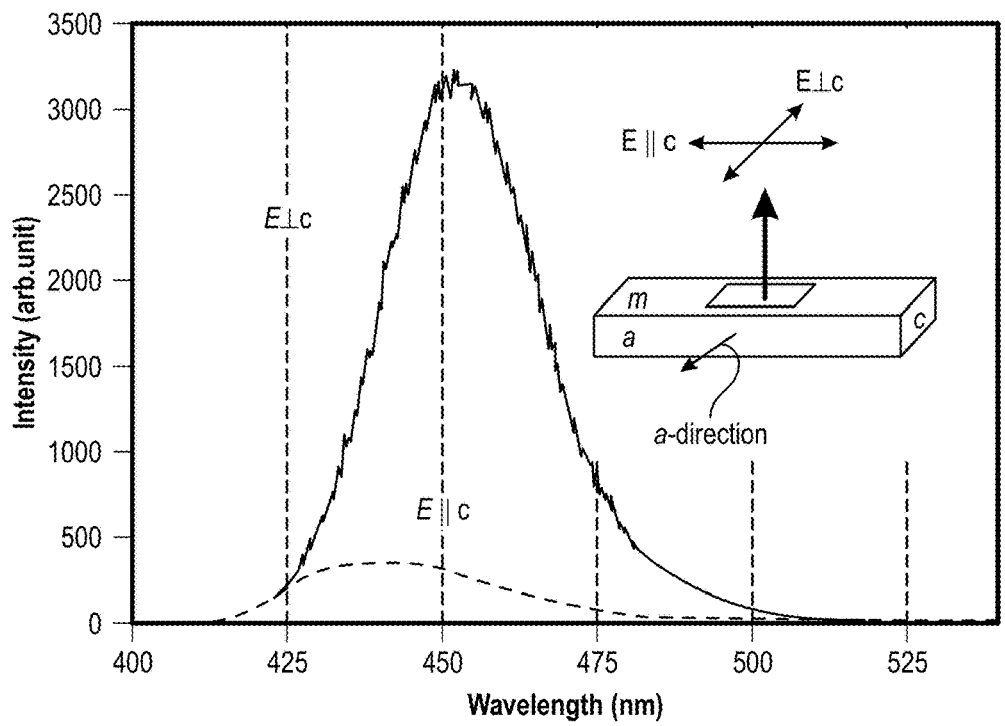
Figure 1D:
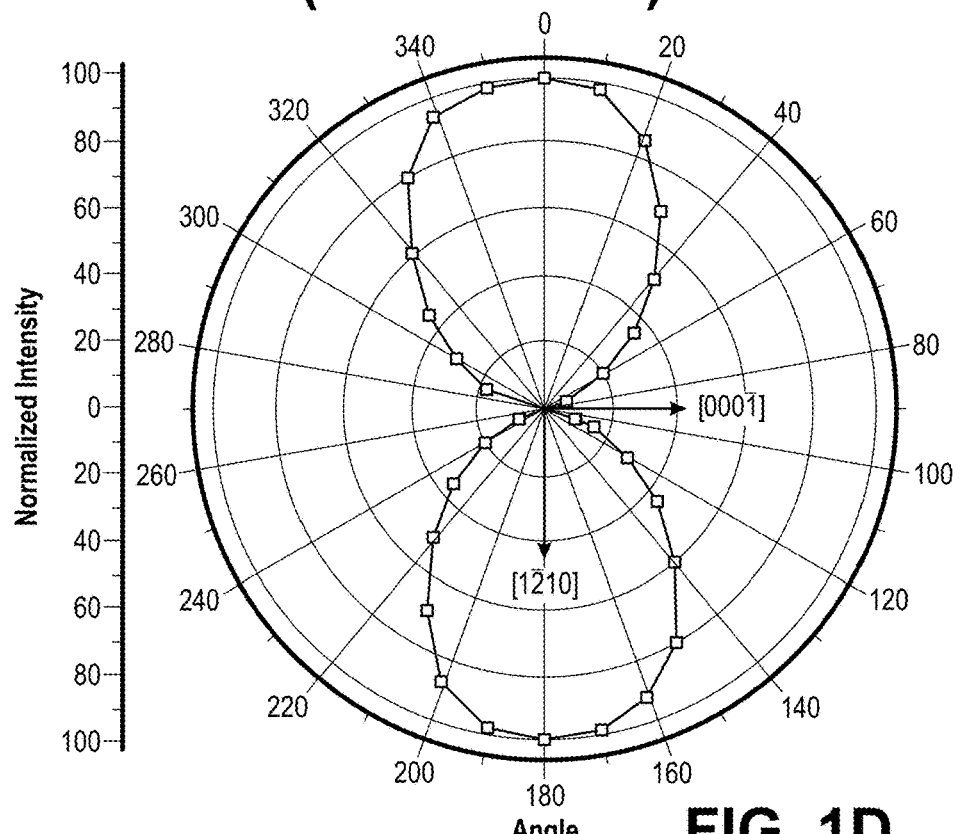

Incorporating subwavelength air-voids or nanopores in alternating layers allows high-refractive-index-contrast between the layers. The nanoporous layers are created by the anodic electrochemical (EC) etching of highly doped n-type GaN in certain acids. The selectivity of the nanopores in the n-type doped layers effectively lowers the refractive index compared to the adjacent unintentionally doped bulk GaN layers. Using this technique a DBR mirror reflectance >98% was demonstrated with only 15 pairs. Later, an optically pumped 2-λ hybrid VCSEL that exhibited a single longitudinal lasing mode at 462 nm with a threshold power density of ~5 kW/cm$^2$ and a FWHM of ~0.12 nm was developed. Finally, the first electrically injected nonpolar m-plane GaN-based VCSELs using lattice-matched nanoporous bottom DBRs. Lasing under pulsed operation at room temperature was observed near 409 nm with a linewidth of ~0.6 nm and a maximum output power of ~1.5 mW. All tested devices were linearly polarized and polarization-pinned in the a-direction with a polarization ratio of 0.94. FIG. 1A, FIG. 1B, FIG. 1C, and FIG. 1D are prior art and show polar and nonpolar crystal characteristics, where FIG. 1A shows a polar example (0001) along the c-plane, FIG. 1B shows a nonpolar example (10$\bar{1}$0) along the m-plane, FIG. 1C show a plot of intensity vs. wavelength, and FIG. 1D shows a polar plot. In FIG. 1C, a crystal is shown with a, c, and m planes labeled. The a-direction is perpendicular to the a-plane, the m-direction is perpendicular to the m-plane, and the c-direction is perpendicular to the c-plane.

Figure 2A:
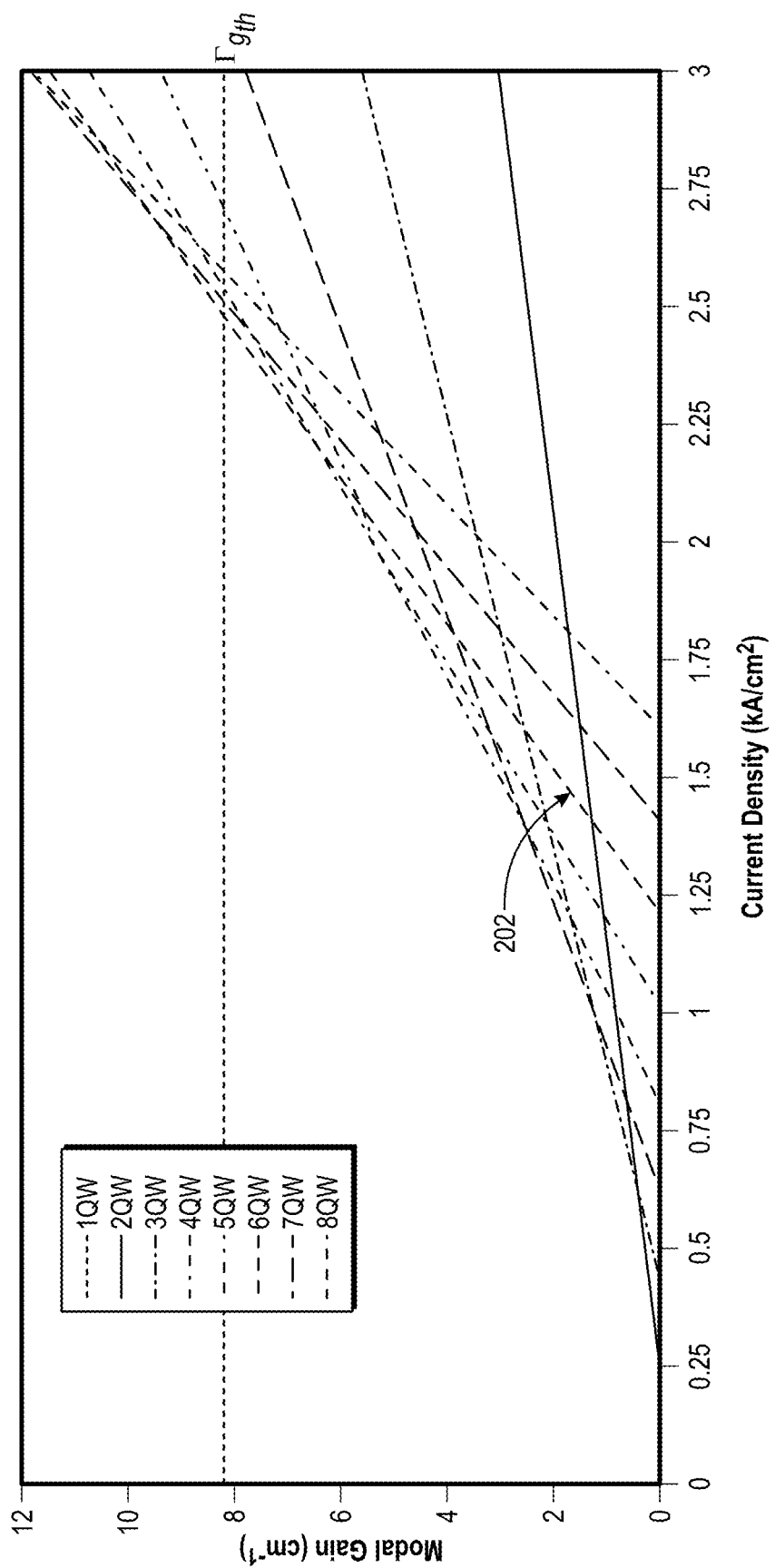
FIG. 2A shows a plot of modal gain vs. current density plot for 1 QW to 8 QWs with a QW thickness of 4 nm and barrier thickness of 2 nm. TMM simulated threshold modal gain is overlaid on the plot to determine which yields the lowest threshold current density.
Figure 2B:
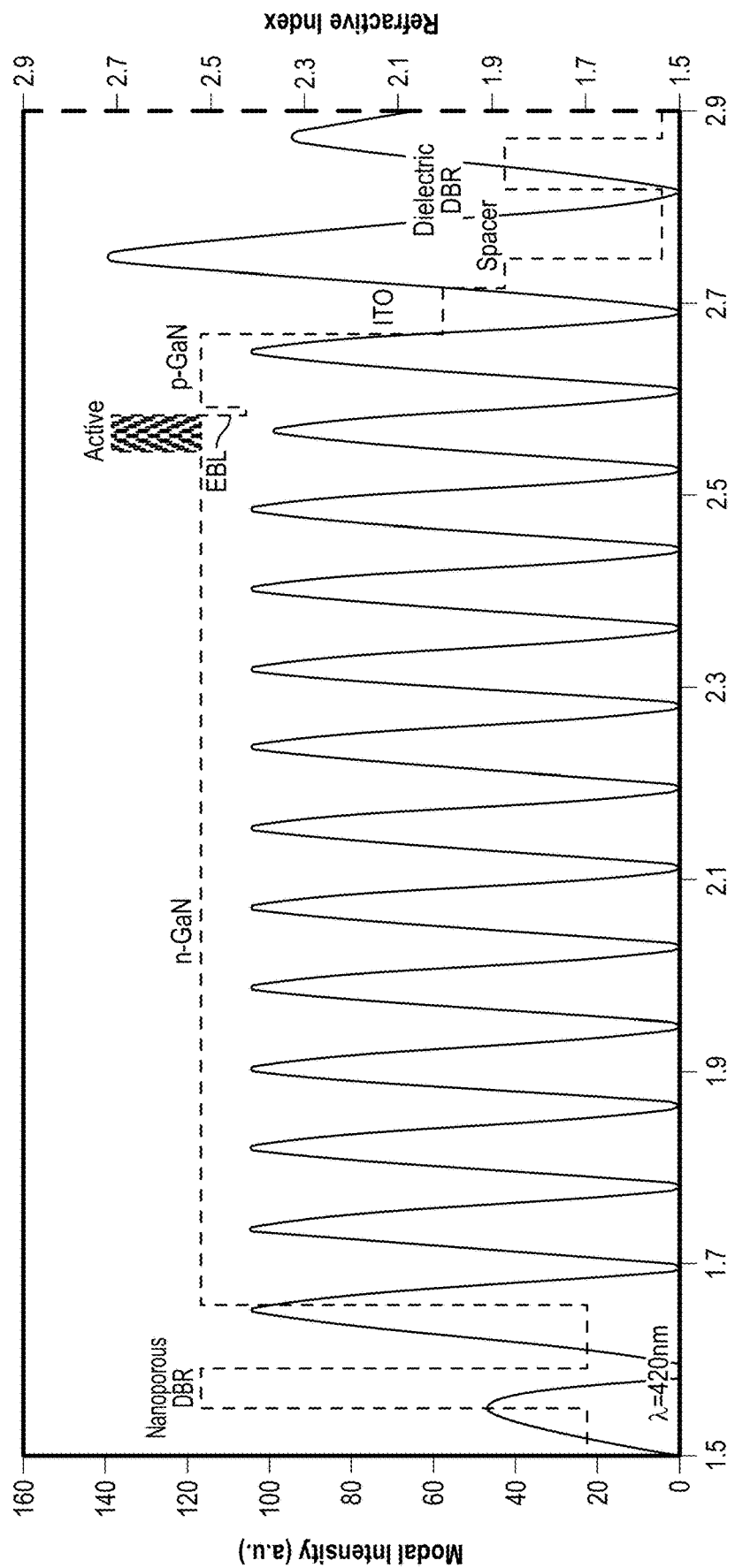
FIG. 2B shows results of a TMM simulation of the cavity mode intensity and refractive index profile for a 6-QW design.

FIG. 2A shows a plot of modal gain vs. current density plot for 1 QW to 8 QWs with a QW thickness of 4 nm and barrier thickness of 2 nm. TMM simulated threshold modal gain is overlaid on the plot to determine which yields the lowest threshold current density. FIG. 2B shows results of a TMM simulation of the cavity mode intensity and refractive index profile for a 6-QW design.

Figure 3A:
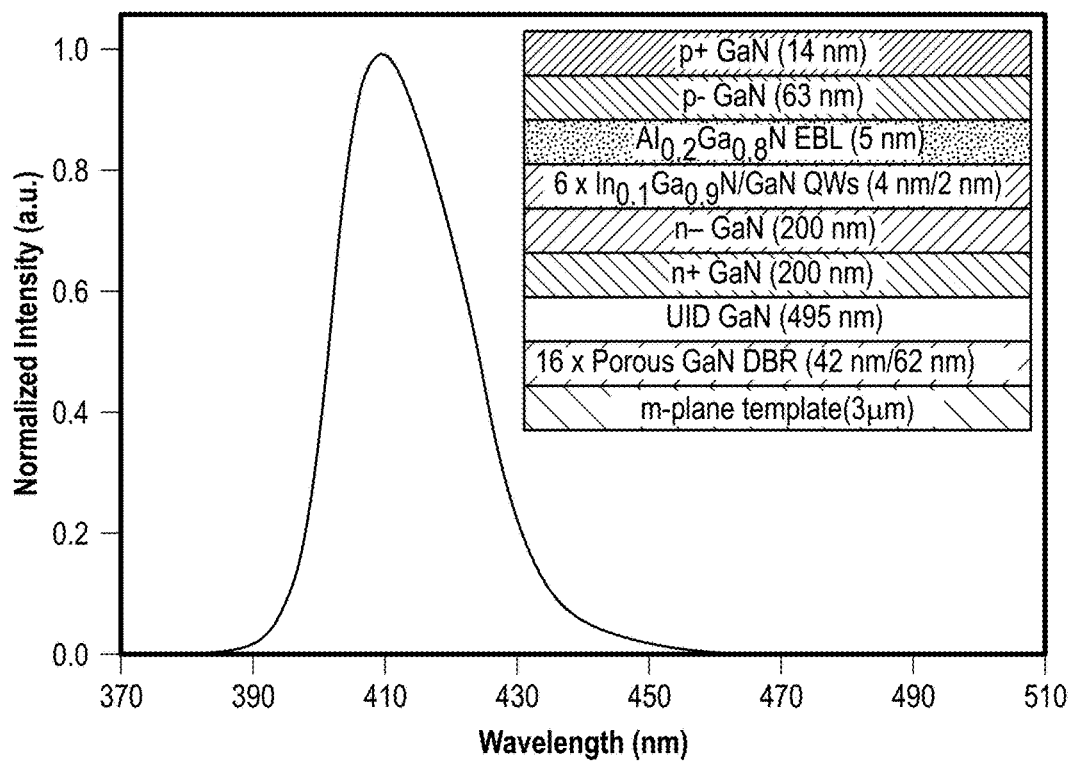
FIG. 3A shows a plot of spontaneous emission EL spectrum of the nanoporous VCSEL sample. [Inset] Epilayer stack of the sample showing the layer thicknesses and the repetitions.
Figure 3B:
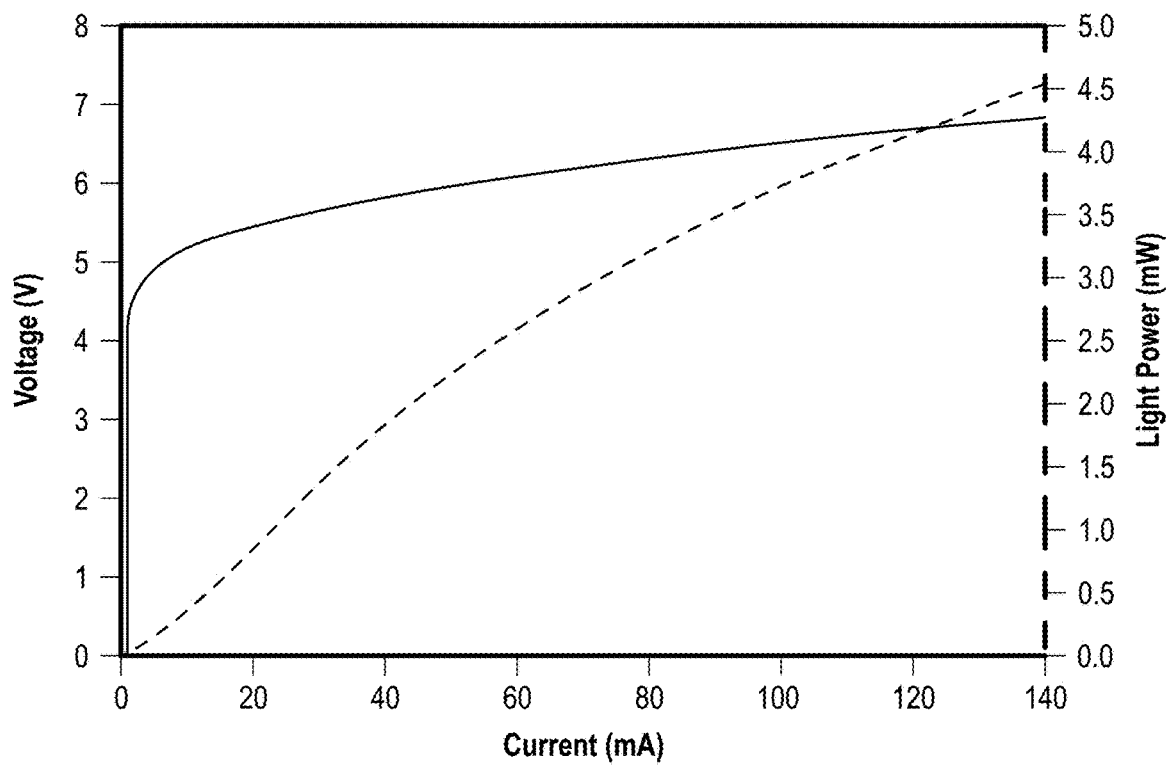
FIG. 3B shows plots of a quick-test spontaneous emission L-I-V characteristics of the sample with a turn-on at 4.5 V and a 3.75 mW output power at 100 mA.

As shown in FIG. 2A, plots of the gain curves for 1-8 QWs with 2 nm barriers. The standing-wave and the refractive index profile of the cavity with an effective optical thickness of 8–λ ($L_{eff} \times n_{eff} \approx 1453$ nm×2.26) is illustrated in FIG. 2B, with the QWs positioned at a longitudinal mode peak and the indium tin oxide (ITO) at a null to maximize gain and minimize loss. The threshold modal gain of the cavity obtained from the TMM simulation was ~8.4 cm$^{-1}$. Overlaying this value on top of FIG. 2A, it can be seen that the lowest current density for this modal gain can be achieved with 6 QWs, highlighted by line 202. The electron blocking layer (EBL) comprises a 5 nm p-doped $Al_{0.2}Ga_{0.8}N$ layer. FIG. 3A shows a plot of spontaneous emission EL spectrum of the nanoporous VCSEL sample. [Inset] Epilayer stack of the sample showing the layer thicknesses and some layer repetitions. FIG. 3B shows plots of the spontaneous emission quick-test L-I-V characteristics of the sample with a turn-on at 4.5 V and a 3.75 mW output power at 100 mA.

An m-plane VCSEL sample was then grown with the epilayers consisting of a 3-μm-thick n–GaN template, 16 pairs of alternating unintentionally doped (UID)/n+GaN (Si-doping concentration ~1×10$^{19}$ cm$^{-3}$) layers with thicknesses of 42 nm/62 nm for the bottom DBR, 495 nm of unintentionally doped (UID) GaN for thermal spreading, a 200 nm n+GaN contact layer, a 200 nm n–GaN cladding layer, a six-pair In$_{0.1}$Ga$_{0.9}$N/GaN active region with thicknesses of 4 nm/2 nm emitting at ~407 nm, a 5 nm p–Al$_{0.2}$Ga$_{0.8}$N electron blocking layer, a 63 nm p–GaN cladding layer, and a 14 nm p+GaN contact layer. The spontaneous emission EL spectrum and spontaneous emission L-I-V characteristics of the sample were collected after growth and before fabrication and are plotted in FIG. 3A and FIG. 3B, respectively. The actual peak emission wavelength was 410 nm. The device turn-on was around 4.5 V with a series resistance of ~10Ω. Both the turn-on voltage and series resistance can be improved with the optimization of the EBL and p–GaN layers.

FIGS. 4A-4L show processing steps for the fabrication of the m-plane nanoporous VCSEL. FIG. 4A shows an epitaxy growth step comprising template layer 402, unetched NP-DBR layer 404, UID GaN thermal layer 406, n+GaN layer 408, n– GaN layer 410, MQW active layers 412, p– GaN layer 414, and p+GaN layer 416. FIG. 4B shows a formation of Mesa 1 from the arrangement of FIG. 4A. FIG. 4C shows Al ion implantation on the arrangement of FIG. 4B by Al ion implanting specific areas 418. FIG. 4D shows formation of Mesa 2 from the arrangement of FIG. 4C. FIG. 4E shows a SiO$_2$ passivation layer on a top surface and sidewalls of Mesa 2 from the arrangement of FIG. 4D by deposition of dielectric layer 420. FIG. 4F shows formation of a trench etch based on the arrangement of FIG. 4E. FIG. 4G shows an Electrochemical (EC) porosification based on the arrangement of FIG. 4F with porosified NP-DBR layer 422. FIG. 3H shows a patterned SiO$_2$ passivation layer based on the arrangement of FIG. 4G. FIG. 4I shows an ITO deposition layer 424 based on the arrangement of FIG. 4H where formation of the ITO deposition layer 424 is formed on a top surface of Al ion implant layer 418 and p+GaN layer 416. FIG. 4J shows a p-metal deposition based on the arrangement of FIG. 4I by formation of p-metal layer 426 on a top surface of ITO deposition layer 424. FIG. 4K shows a n–metal deposition based on the arrangement of FIG. 4J by formation of n-metal layer 428 on a portion of a top surface of n+GaN layer 408. FIG. 4L shows a dielectric DBR deposition based on the arrangement of FIG. 4K by formation of dielectric DBR layer 430 on a top surface of ITO deposition layer 424 and between n-metal layer 428.

Following the growth, the sample was fabricated according the to the process flow depicted in FIGS. 4A-4H. First, a mesa was etched (Mesa 1) using ICP etching to expose the n+GaN contact layer. Next, the sample was patterned with a Ti/Au hard mask to define the current apertures and then implanted with Al-ion. Aperture diameters of 5 μm, 10 μm, 15 μm, and 20 μm were defined in this step. After implantation, the Ti/Au hard mask was removed in aqua regia. A second mesa with a depth of 400 nm was ICP etched (Mesa 2) and followed by a blanket e-beam deposition of 150 nm SiO$_2$ to protect the active region and contact layers during the porosification step of the nanoporous DBRs. Next, deep trenches aligned along the c-direction were etched to expose the sidewalls of the DBR stack. Following this, the DBRs were EC etched for 14 hours to selectively porosify the highly doped n-type DBR layers using a bias voltage of 5 V at 100 rpm stirring. Complete porosification was confirmed when the two lateral etch fronts along the a-direction met at the center of the trench. Next, the blanket SiO$_2$ was stripped in buffered HF and a patterned layer of SiNx was deposited across Mesa 1 and the trench to passivate the sidewalls of the active region and the nanoporous DBRs. Passivation of the DBR sidewalls was required to prevent the build-up of undeveloped PR from the subsequent steps. 50 nm of ITO was e-beam deposited and annealed under nitrogen ambient at 550° C. for 15 minutes, after which the p-metal and n-metal were deposited and consisted of Ti/Au (20 nm/300 nm) and Ti/Al/Ni/Au (20 nm/100 nm/50 nm/300 nm), respectively. Finally, a 30-nm-thick SiN$_x$ cavity spacer and the top dielectric DBR were blanket deposited using PECVD then patterned and etched down using RIE. The top DBR consists of 25 pairs of alternating $\lambda/4n_{SiO2}$-thick SiO$_2$ and $\lambda/4n_{SiN_x}$-thick SiN$_x$.

Figure 5:
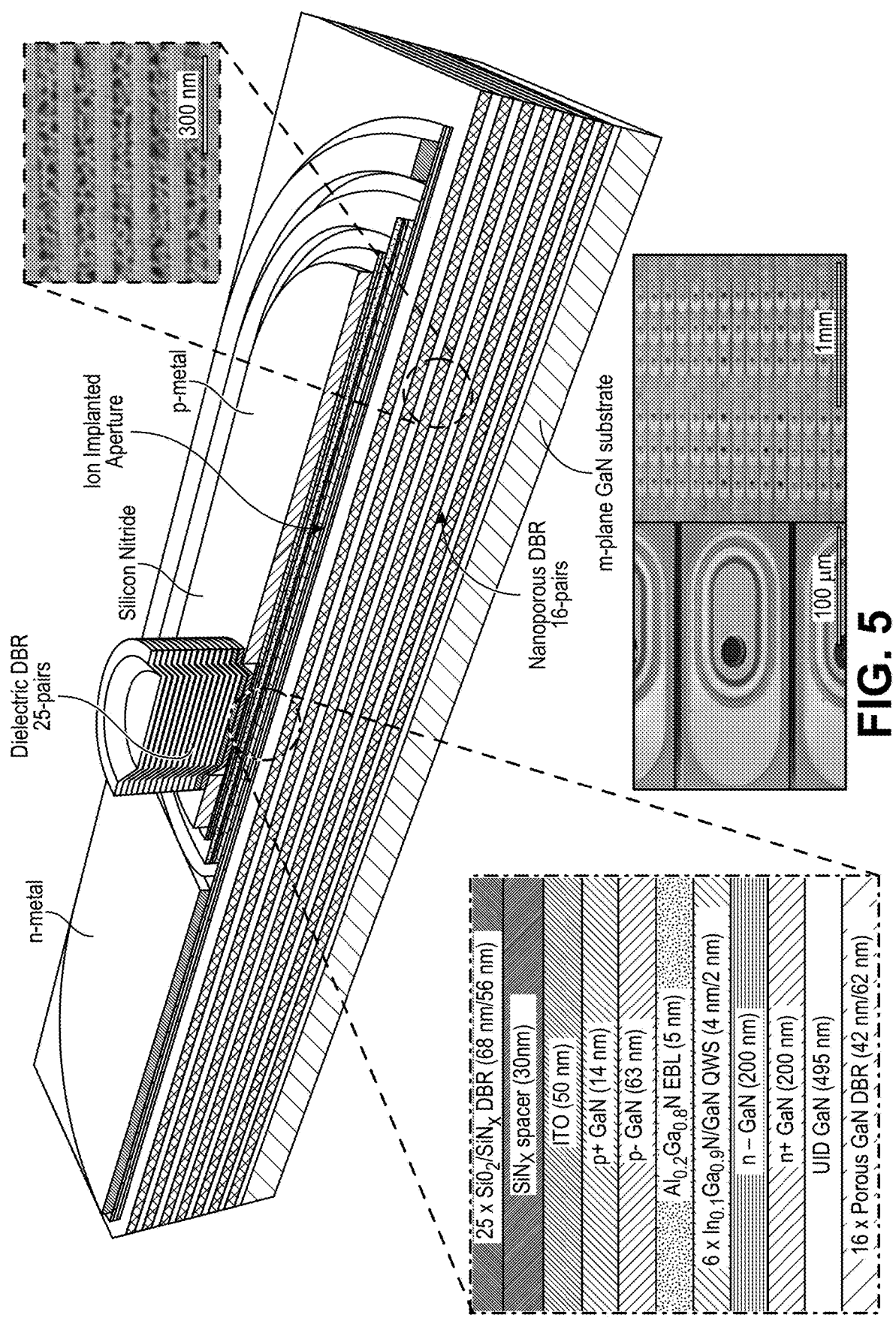
FIG. 5 shows mages of an angled topographic view of the VCSEL structure and cross-sectional SEM image of a representative bottom nanoporous DBR.
Figure 6:
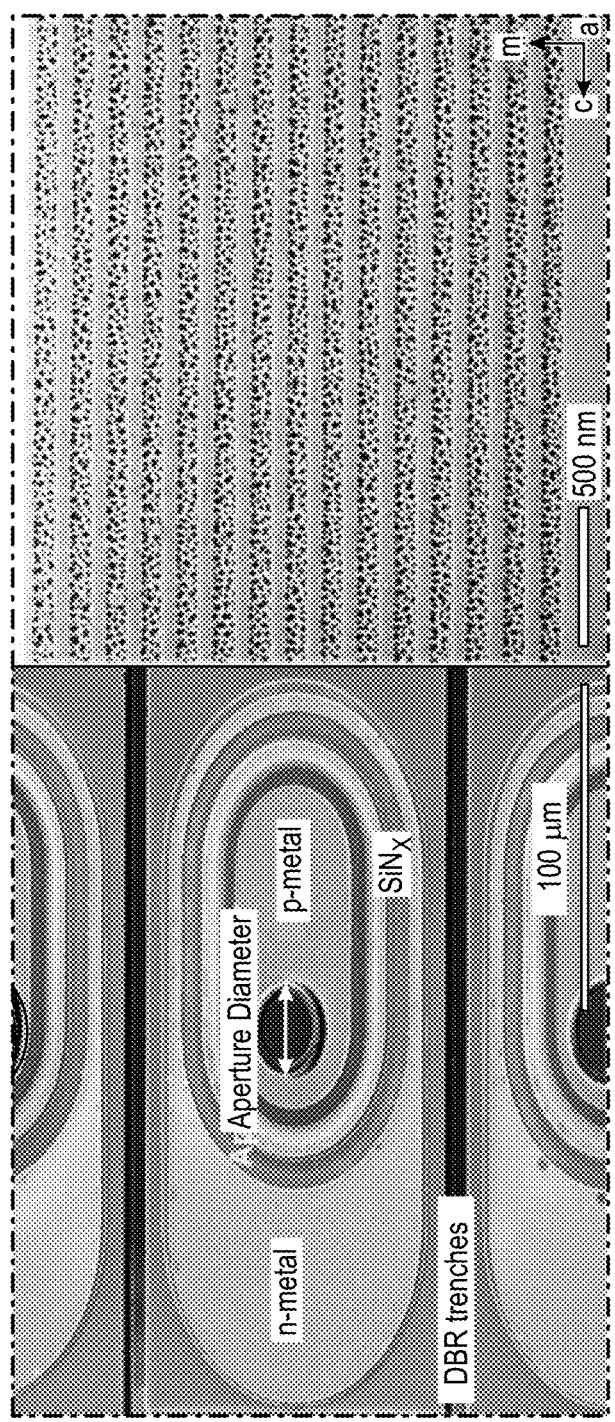
FIG. 6 shows additional images of an angled topographic view of the VCSEL structure and cross-sectional SEM image of a representative bottom nanoporous DBR.

FIG. 5 shows a schematic illustration of the VCSEL structure, the epitaxial layer structure of the VCSEL, and SEM images of an angled topographic views of the VCSEL structure and cross-sectional SEM image of a representative bottom nanoporous DBR. FIG. 6 shows additional SEM images of an angled topographic view of the VCSEL structure and cross-sectional SEM image of a representative bottom nanoporous DBR.

Figure 7A:
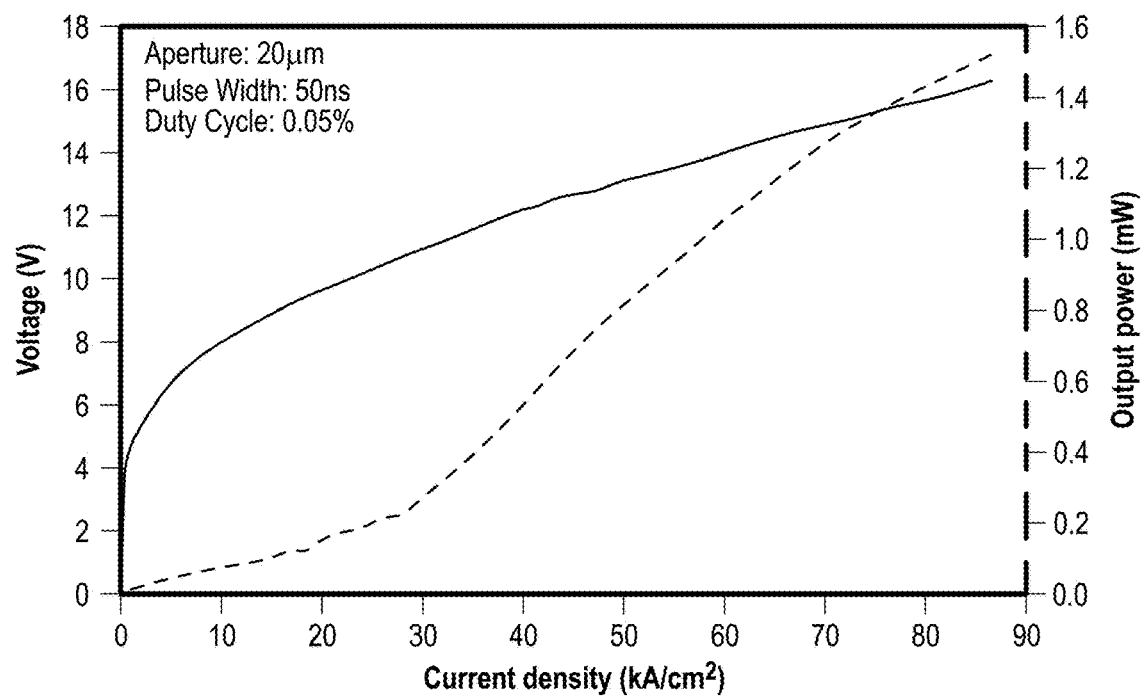
FIG. 7A shows a L-J-V plot of a 20 µm diameter nanoporous VCSEL under pulsed operation.
Figure 7B:
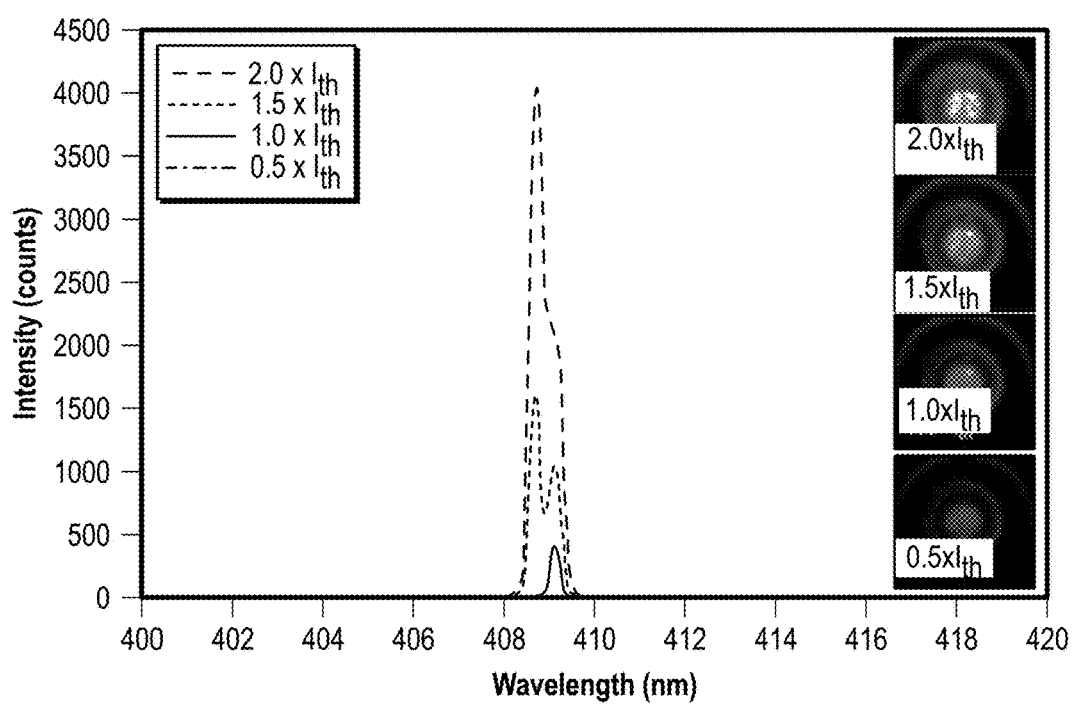
FIG. 7B shows an emission spectrum under various pump currents and the corresponding near-field images of the aperture region.

FIG. 7A shows an L-J-V plot of a 20-μm-diameter nanoporous VCSEL under pulsed operation. FIG. 7B shows an emission spectrum under various pump currents and the corresponding near-field images of the aperture region at various operating currents. As shown in FIG. 7A, the light-current density-voltage (L-J-V) characteristics of a VCSEL with a 20 μm diameter aperture is shown. The threshold current density is ~20 kA/cm$^2$ and the maximum output power is 1.5 mW. As shown in FIG. 7B, the lasing spectrum for the same device, with a peak wavelength of 408.7 nm and a FWHM of 0.6 nm. The inset images show the intensity from the aperture area at various bias currents.

Figure 8A:
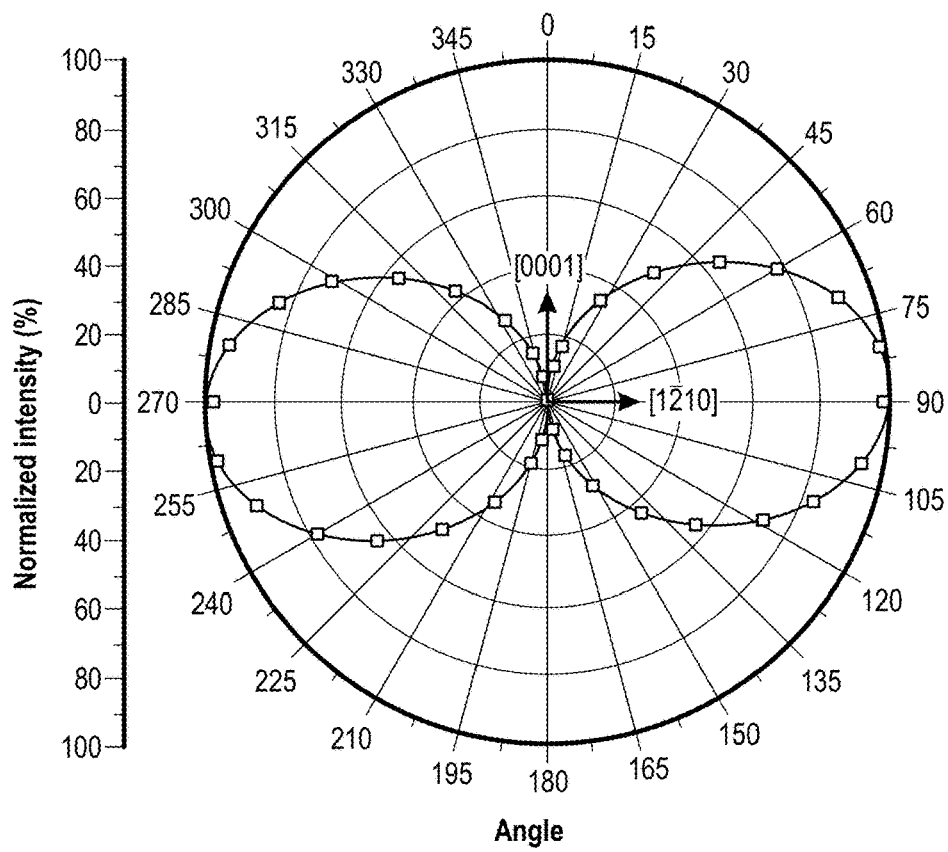
FIG. 8A shows a polar plot showing stable polarization pinned emission along [1210] (a-direction).
Figure 8B:
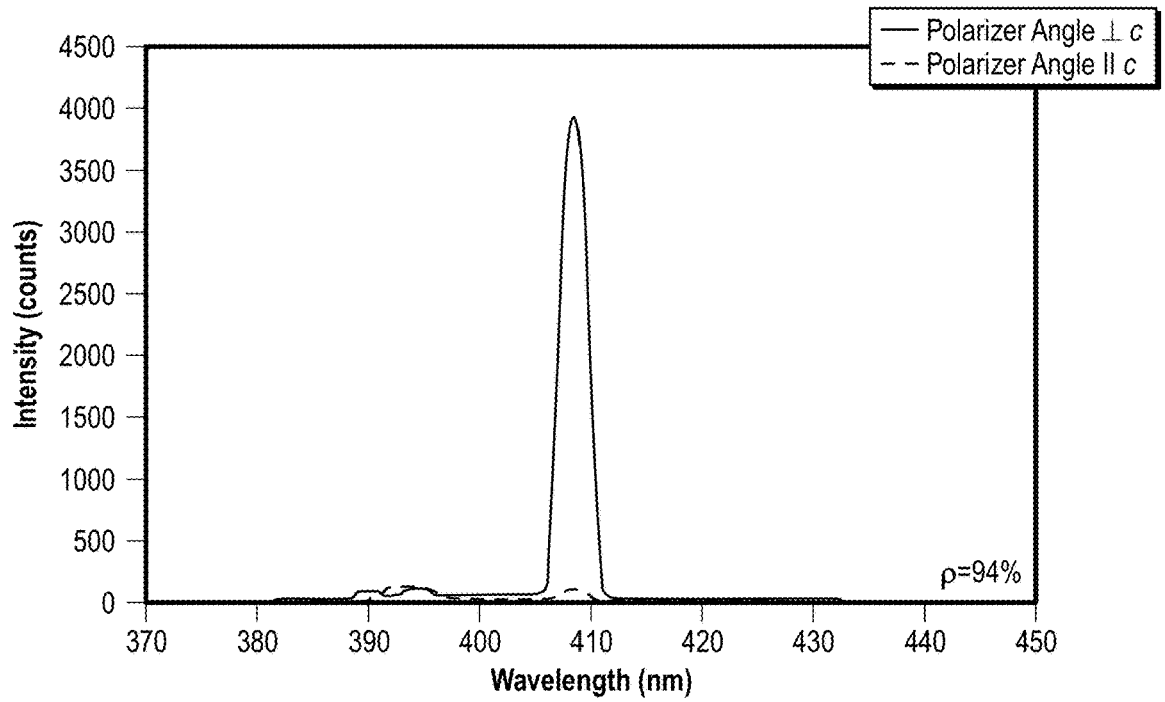
FIG. 8B shows a spectrum when the polarizer angle is perpendicular and parallel to [0001].

FIG. 8A shows a polar plot showing stable polarization pinned emission along [1210] (the a-direction). FIG. 8B shows a spectrum when the polarizer angle is perpendicular and parallel to [0001]. A plot of the normalized output power as a function of polarizer angle reveals that the emission is polarization pinned along the a-direction of the crystal. All tested devices showed polarization pinning along the a-direction. FIG. 8B shows the spectrum with the polarizer parallel and perpendicular to the c-direction. Maximum transmission is obtained with the polarizer perpendicular to the c-direction (along the a-direction). The measured polarization ratio was 0.94.

Figure 9A:
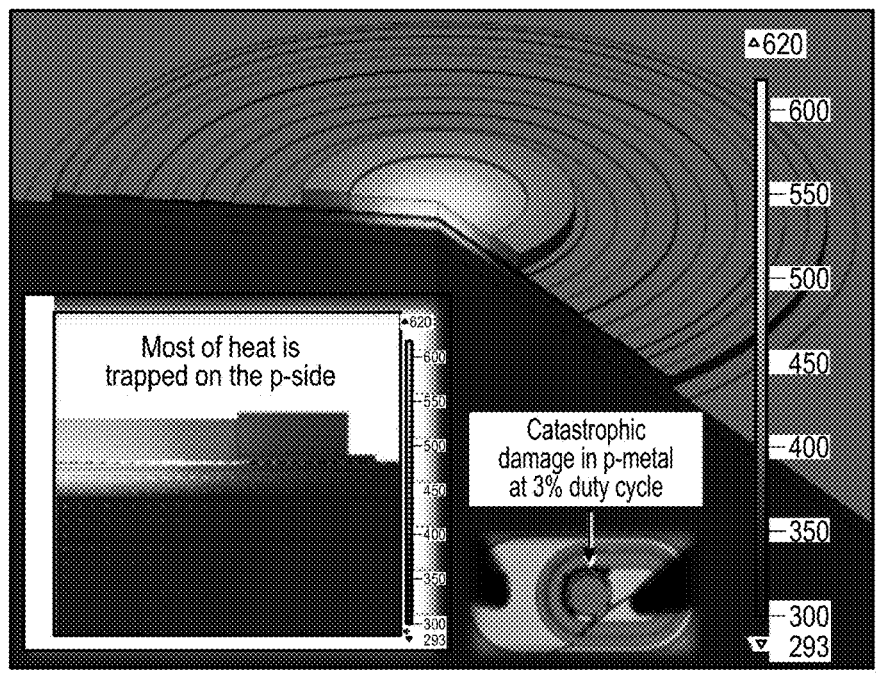
FIG. 9A shows an axisymmetric COMSOL simulation of the nanoporous VCSEL showing the temperature profile and (inset) heat flow in the cavity layers. It also shows a microscope image of a device with p-metal damage due to heating at 3% duty cycle.
Figure 9B:
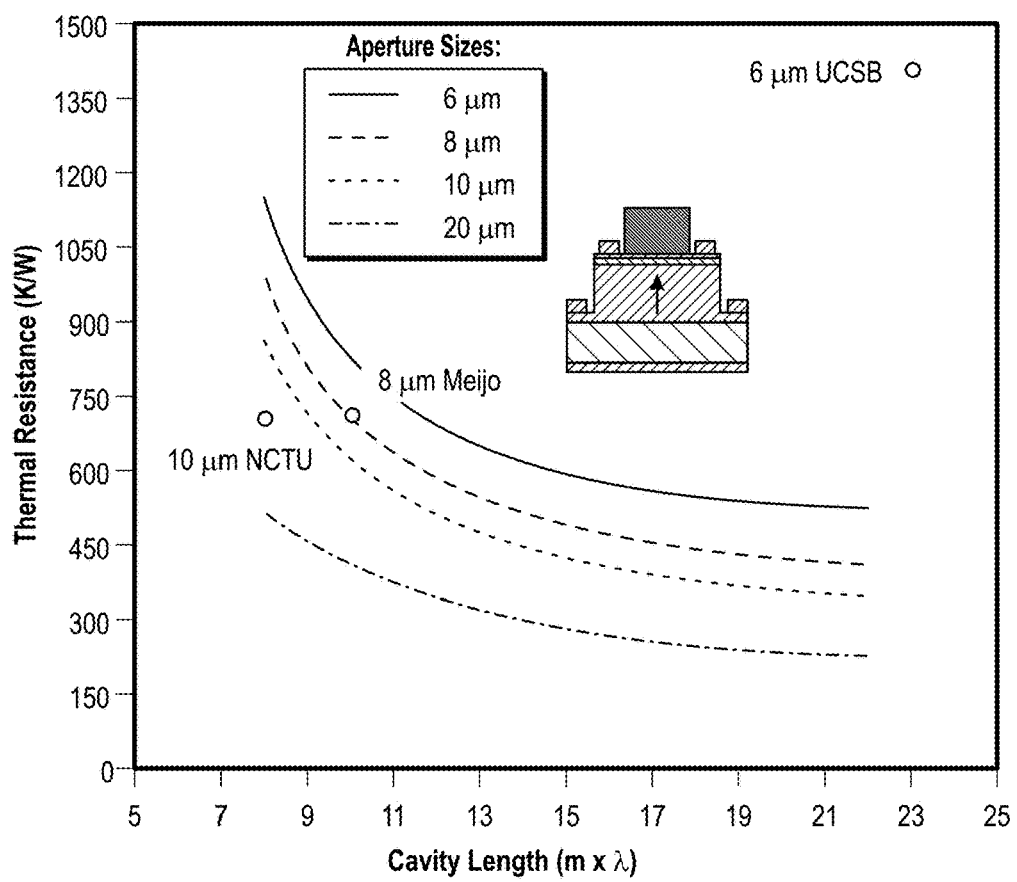
FIG. 9B shows a plot of $Z_t$ vs. cavity length for the nanoporous VCSEL with different aperture sizes. Overlaid are the thermal resistances of reported CW-RT VCSELs by NCTU, Meijo-Stanley, and UCSB.

FIG. 9A shows an axisymmetric COMSOL™ simulation of the nanoporous VCSEL showing the temperature profile and (inset) heat flow in the cavity layers. It also shows a microscope image of a device with p-metal damage due to heating at 3% duty cycle. FIG. 9B shows a plot of thermal resistance (Z$_t$) vs. cavity length for the nanoporous VCSEL with different aperture sizes. Overlaid are the thermal resistances of reported CW-RT VCSELs by other research groups.

Figure 10:
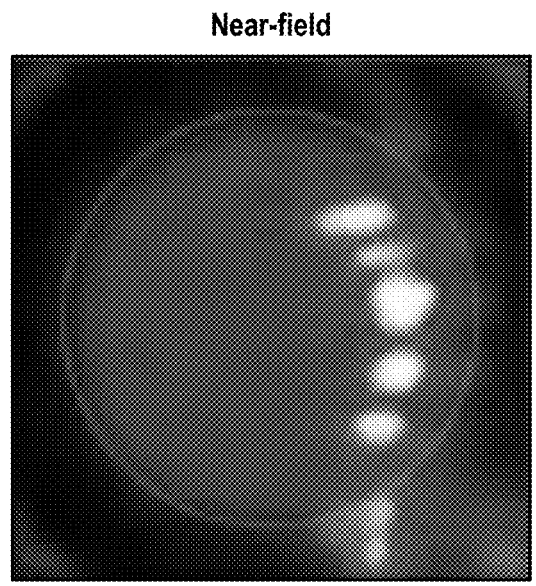
FIG. 10 shows two examples of the near-field emission pattern and mode simulation of a 20 μm diameter nanoporous VCSEL aperture.
Figure 10:
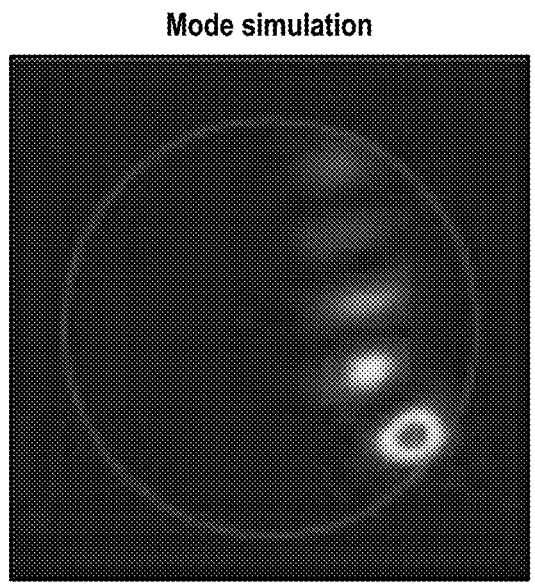
Figure 10:
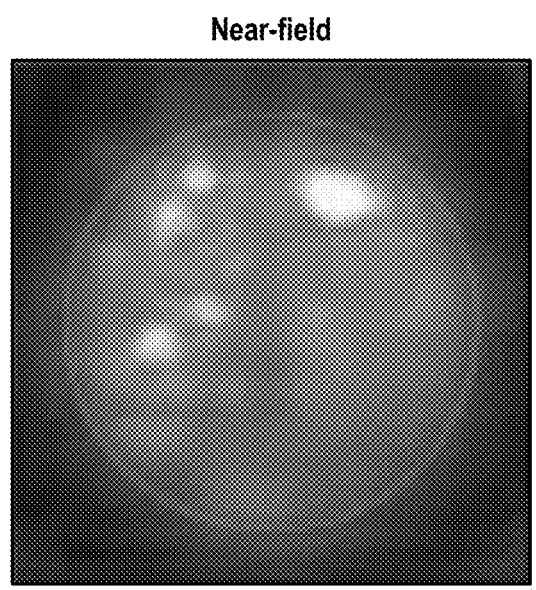
Figure 10:
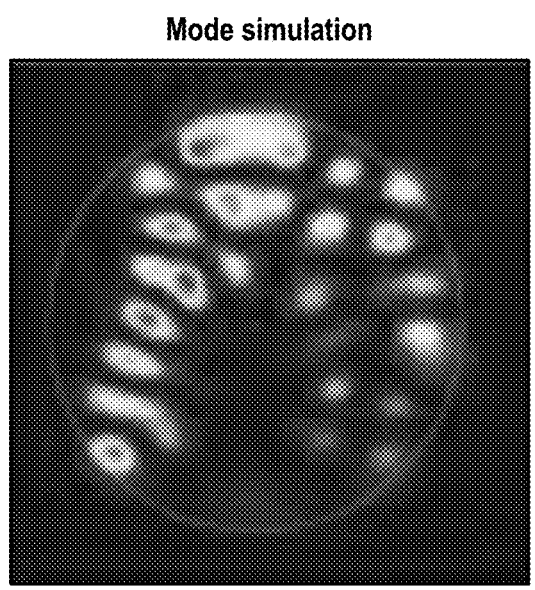

FIG. 10 shows two examples of the near-field emission pattern and mode simulation of a 20 μm diameter nanoporous VCSEL aperture. The random nature of the filamentation coupled with the distinct divide across the aperture by the nanoporous etch fronts strongly hinted that the filamentation may originate from the non-uniformity in the cavity resonance. This was verified by simulating a similar core-cladding model but with the addition of nanoscale regions with slightly higher refractive index scattered randomly throughout the core region. The small index change was calculated using $\Delta n/n=\Delta\lambda/\lambda$, where $\Delta\lambda$ is the difference in wavelength obtained from the two peaks observed in our previous optical pumped VCSEL with λ being the dominant peak.

Figure 11A:
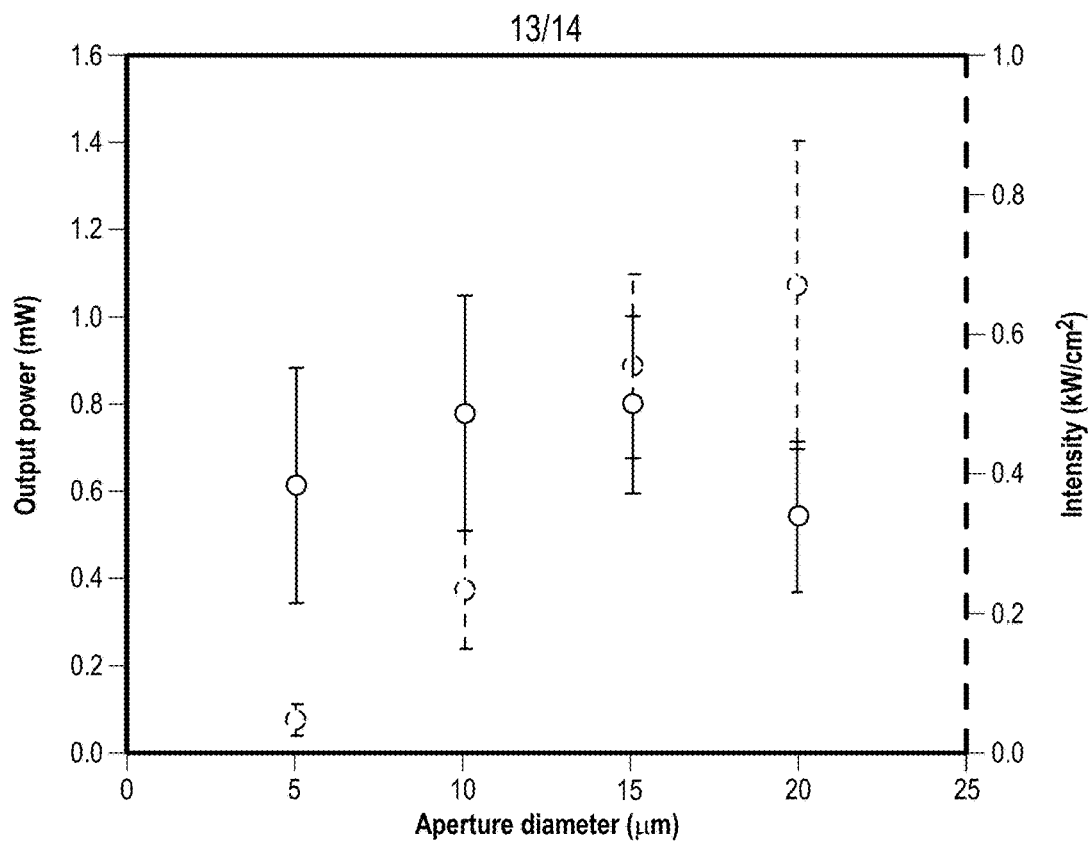
FIG. 11A, FIG. 11B, FIG. 11C, and FIG. 11D show plots showing the (FIG. 11A) output power/intensity, (FIG. 11B) slope efficiency, (FIG. 11C) threshold current/current density, and (FIG. 11D) differential resistance as a function of the aperture size. The data represent the average of 50 device measurements with error bars.
Figure 11B:
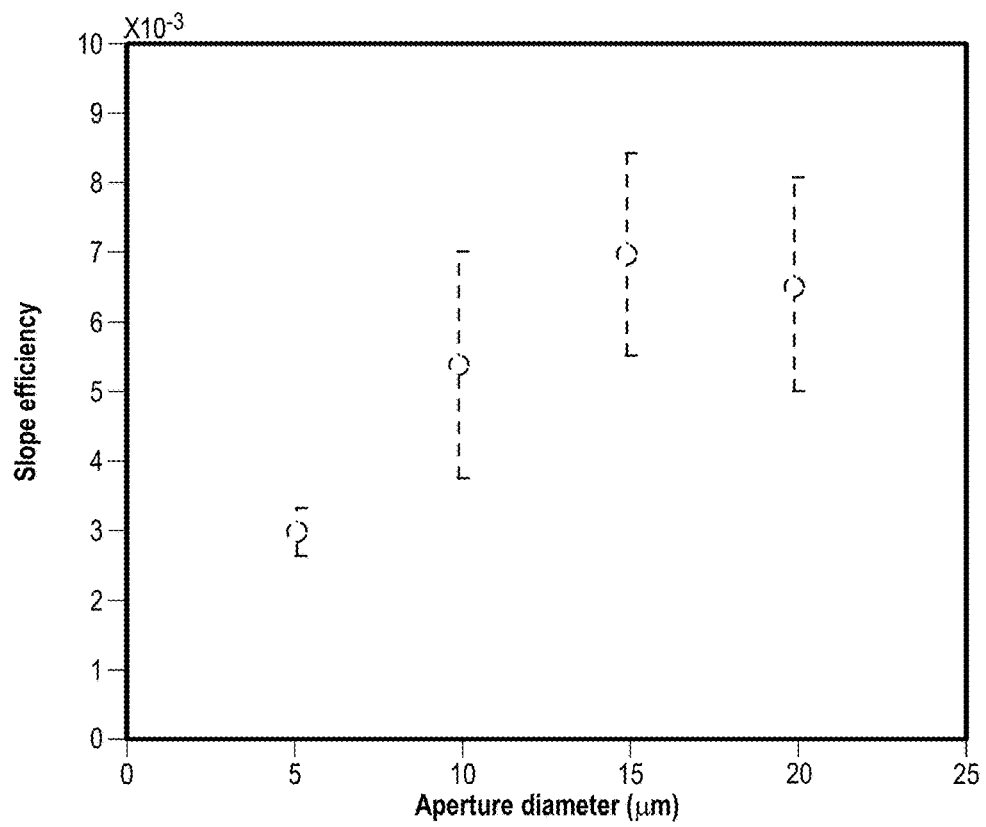
Figure 11C:
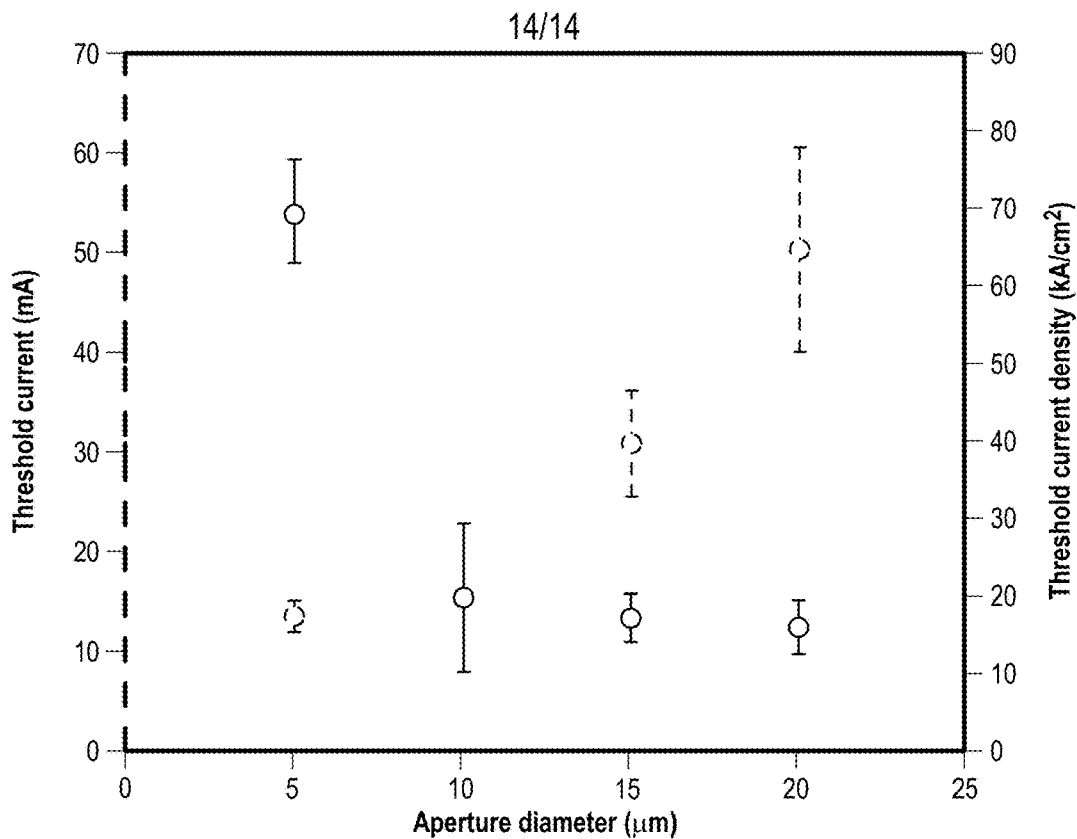
Figure 11D:
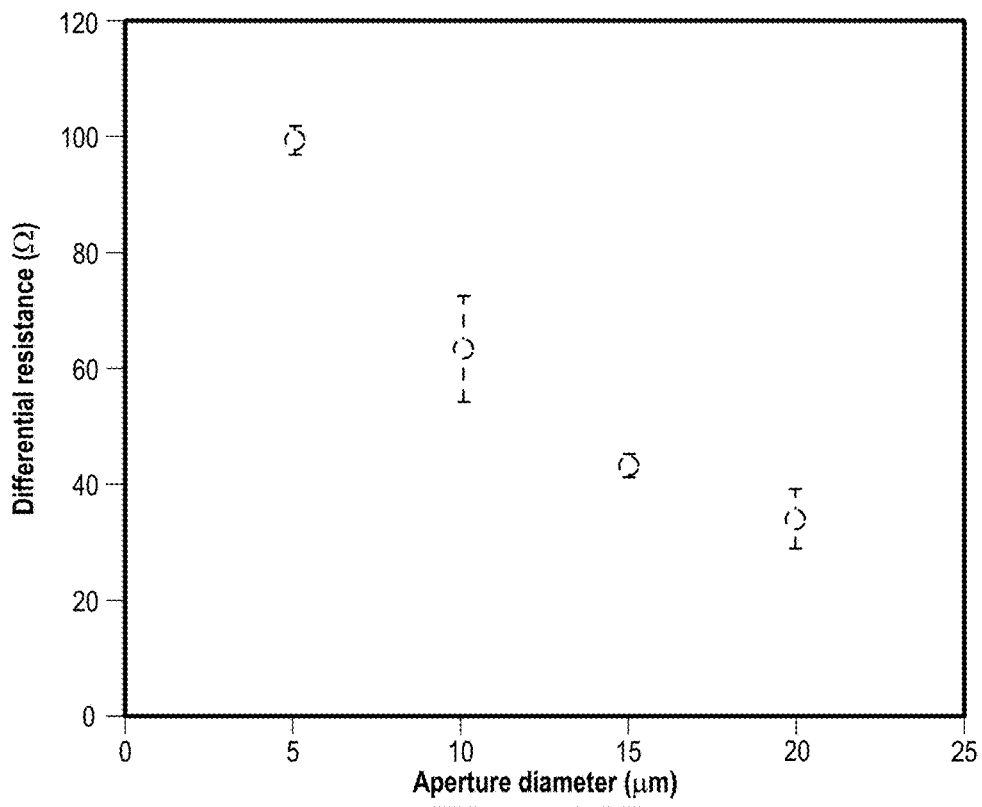

FIG. 11A, FIG. 11B, FIG. 11C, and FIG. 11D show plots showing the (FIG. 11A) output power/intensity, (FIG. 11B) slope efficiency, (FIG. 11C) threshold current/current density, and (FIG. 11D) differential resistance as a function of the aperture size. The data represent the average of 50 device measurements with error bars. FIG. 11A, FIG. 11B, FIG. 11C, and FIG. 11D show plots the (FIG. 11A) output power/intensity, (FIG. 11B) slope efficiency, (FIG. 11C) threshold current/current density, and (FIG. 11D) differential resistance as a function of the aperture size. The data points represent the average value of all the devices tested for that particular aperture diameter with error bars. In FIG. 11A, the total output power increases almost linearly with increasing aperture sizes because of the enlarged emission areas. However, the emission intensity remained reasonably constant for the 10 μm and 15 μm but dropped for the 20 μm aperture. Given the filamentary nature of emission observed in the VCSELs, the average output power is expected to drop due to specular non-uniform emission from large apertures. The lower intensity of the 5 μm aperture may be due to the lasing spot being in close proximity to the non-ideal etch front divide in the nanoporous DBRs. We see similar trends for the slope efficiency in FIG. 11B, which correlates with the output power. The drop in slope efficiency for the 20 μm is likely a result of nonuniform current spreading in the ITO. More current is required near the center of the aperture to obtain the same power of stimulated emission occurring at the edge. The current spreading in the p-side can be significantly improved by replacing the ITO with a GaN-based Ti, which will also help reduce the layer absorption loss. Now for the threshold current, increasing the aperture size generally means an increased $I_{th}$ as more current is needed to inject across a larger area to reach the same threshold current density. However, in FIG. 11C, the current density drastically changes from ~60 kA/cm² for the 5 μm to ~15 kA/cm² for the 10 μm aperture. This is primarily due to poor lateral confinement in the 5 μm apertures, in addition to the lasing spot being at a non-ideal location near where the EC etch fronts meet. FIG. 11D plots the differential resistance against the aperture size, where it drops gradually from ~100Ω to ~34Ω. All the VCSELs had the same device dimensions apart from the aperture diameters, meaning that the current flow was restricted in the axial direction for the smaller apertures resulting in the high differential resistance. The larger aperture sizes allow the flow of current at lower voltages. Overall, the trends in FIG. 11A-FIG. 11D highlight the importance of choosing the proper aperture diameters. Small apertures suffer from weak confinement, while large apertures suffer from filamentation and non-uniform current spreading. It appears that for the current design, 10 μm and 15 μm apertures are the most optimized. Addressing some of these issues in future designs will improve the device characteristic in other aperture sizes as well.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

While the preferred embodiments have been shown and described, it will be understood that there is no intent to limit the invention by such disclosure, but rather, is intended to cover all modifications and alternate constructions falling within the spirit and scope of the invention.

What is claimed is:

1. An electrically injected III-nitride vertical-cavity surface emitting laser (VCSEL) comprising:
   a non-c-plane substrate;
   an epitaxial nanoporous bottom distributed Bragg reflector (DBR) comprising a plurality of alternating highly doped III-nitride layers and unintentionally doped III-nitride layers formed above the substrate;
   an GaN heat spreading layer formed directly on a surface of the epitaxial nanoporous bottom DBR;

an indium tin oxide (ITO) layer formed above the GaN heat spreading layer;
an n+GaN contact layer;
an n−GaN cladding layer;
an active region;
an electron blocking layer;
a p−GaN cladding layer;
an p+GaN contact layer;
a cavity spacer; and
a top DBR,
wherein the GaN heat spreading layer comprises unintentionally doped GaN.

2. The electrically injected III-nitride VCSEL of claim 1, wherein an index of refraction of the highly doped III-nitride layers of the epitaxial nanoporous bottom DBR is controlled by an amount of porosity in the highly doped III-nitride layers, wherein the porosity comprises a plurality of subwavelength air voids.

3. The electrically injected VCSEL of claim 1, wherein the non-c-plane substrate is a nonpolar m-plane III-nitride substrate.

4. The electrically injected VCSEL of claim 1, wherein the non-c-plane III-nitride substrate is at an angle between a c-plane and an m-plane of the III-nitride substrate, including angles beyond the m-plane to minus c-plane (N face).

5. The electrically injected III-nitride VCSEL of claim 2, wherein a pore size of the plurality of subwavelength air voids is determined based on an electrochemical etch bias voltage, a doping level, and an etchant solution.

6. The electrically injected III-nitride VCSEL of claim 2, wherein a density of the plurality of subwavelength air voids is between about 20% and about 80%, or about 30% and about 70%, or about 40% and about 60%, or about 50%.

7. The electrically injected III-nitride VCSEL of claim 2, wherein a density of the plurality of subwavelength air voids is controlled based on a concentration of Si-doping.

8. The electrically injected III-nitride VCSEL of claim 2, wherein a higher density of the plurality of subwavelength air voids is inversely proportional to a number of layers of the plurality of alternating highly doped III-nitride layers and unintentionally doped III-nitride layers.

9. The electrically injected III-nitride VCSEL of claim 1, wherein the highly doped III-nitride layers and the unintentionally doped III-nitride layers comprise GaN, $In_xGa_{1-x}N$, or $Al_xGa_{1-x}N$.

10. The electrically injected III-nitride VCSEL of claim 1, wherein a majority of radiation emitted by the VCSEL is pinned along an a-direction of the non-c-plane substrate.

11. The electrically injected III-nitride VCSEL of claim 1, wherein an electric field of emitted radiation is polarized along an a-direction.

12. The electrically injected III-nitride VCSEL of claim 1, wherein emitted radiation comprises UV, visible, or infrared.

13. The electrically injected III-nitride VCSEL of claim 1, further comprising a dielectric DBR formed over the nanoporous bottom DBR.

14. The electrically injected III-nitride VCSEL of claim 1, wherein the nanoporous bottom DBR is lattice matched with GaN, or $In_xGa_{1-x}N$, or $Al_xGa_{1-x}N$.

15. The electrically injected III-nitride VCSEL of claim 1, further comprising one or more ion-implanted apertures.

16. An electrically injected III-nitride vertical-cavity surface emitting laser (VCSEL) comprising:
a non-c-plane substrate;
an epitaxial nanoporous bottom distributed Bragg reflector (DBR) comprising a plurality of alternating highly doped III-nitride layers and unintentionally doped III-nitride layers formed above the substrate;
an active region;
one or more ion-implanted apertures formed in an aperture layer above the active region and configured to allow current to flow through the VCSEL;
an unintentionally doped (UID) GaN heat spreading layer formed above the epitaxial nanoporous bottom DBR;
an indium tin oxide (ITO) layer formed above the UID GaN heat spreading layer, and
a cavity spacer formed above the ITO layer.

17. The electrically injected III-nitride VCSEL of claim 16, wherein an index of refraction of the highly doped III-nitride layers of the epitaxial nanoporous bottom DBR is controlled by an amount of porosity in the highly doped III-nitride layers, wherein the porosity comprises a plurality of subwavelength air voids.

18. The electrically injected VCSEL of claim 16, wherein the non-c-substrate is a nonpolar m-plane III-nitride substrate.

19. The electrically injected VCSEL of claim 16, wherein the non-c-plane III-nitride substrate is at an angle between a c-plane and an m-plane of the III-nitride substrate, including angles beyond the m-plane to minus c-plane (N face).

20. The electrically injected III-nitride VCSEL of claim 16, wherein a majority of radiation emitted by the VCSEL is pinned along an a-direction of the non-c-plane substrate.

* * * * *